United States Patent
Chidambarrao et al.

(10) Patent No.: US 8,013,324 B2
(45) Date of Patent: Sep. 6, 2011

(54) STRUCTURALLY STABILIZED SEMICONDUCTOR NANOWIRE

(75) Inventors: Dureseti Chidambarrao, Weston, CT (US); Lidija Sekaric, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 202 days.

(21) Appl. No.: 12/417,815

(22) Filed: Apr. 3, 2009

(65) Prior Publication Data

US 2010/0252815 A1    Oct. 7, 2010

(51) Int. Cl.
*H01L 29/06* (2006.01)

(52) U.S. Cl. .................. 257/24; 257/9; 257/14; 257/18; 257/213; 257/290

(58) Field of Classification Search .......................... None
See application file for complete search history.

(56) References Cited

U.S. PATENT DOCUMENTS

| | | | |
|---|---|---|---|
| 6,231,744 B1 | 5/2001 | Ying et al. |
| 6,248,674 B1 | 6/2001 | Kamins et al. |
| 6,656,573 B2 | 12/2003 | Chen et al. |
| 6,720,240 B2 | 4/2004 | Gole et al. |
| 6,798,000 B2 | 9/2004 | Luyken |
| 6,831,017 B1 | 12/2004 | Li et al. |
| 6,841,235 B2 | 1/2005 | Weiner et al. |
| 6,843,902 B1 | 1/2005 | Penner et al. |
| 6,882,051 B2 | 4/2005 | Majumdar et al. |
| 6,897,098 B2 | 5/2005 | Hareland et al. |
| 6,969,679 B2 | 11/2005 | Okamura et al. |
| 7,067,328 B2 | 6/2006 | Dubrow et al. |
| 7,067,341 B2 | 6/2006 | Mascolo et al. |
| 7,081,293 B2 | 7/2006 | Weiner et al. |
| 7,135,728 B2 | 11/2006 | Duan et al. |
| 7,164,209 B1 | 1/2007 | Duan et al. |
| 7,176,505 B2 | 2/2007 | Rueckes et al. |
| 7,182,996 B2 | 2/2007 | Hong |
| 7,183,568 B2 | 2/2007 | Appenzeller et al. |
| 7,189,635 B2 | 3/2007 | Sharma |
| 7,208,094 B2 | 4/2007 | Islam et al. |
| 7,211,464 B2 | 5/2007 | Lieber et |
| 7,217,946 B2 | 5/2007 | Fraboulet et al. |
| 2002/0014667 A1 | 2/2002 | Shin et al. |
| 2005/0275010 A1* | 12/2005 | Chen et al. ................... 257/315 |
| 2006/0105513 A1 | 5/2006 | Afzali-Ardakani et al. |
| 2006/0151844 A1 | 7/2006 | Avouris et al. |

OTHER PUBLICATIONS

Chang et al., "CMOS Circuit Performance Enhancement by Surface Orientation Optimization", IEEE Transactions on Electron Devices, Oct. 2004, pp. 1621-1627, vol. 51.

\* cited by examiner

*Primary Examiner* — N Drew Richards
*Assistant Examiner* — Kyoung Lee
(74) *Attorney, Agent, or Firm* — Scully, Scott, Murphy & Presser, P.C.; H. Daniel Schnurmann

(57) ABSTRACT

In one embodiment, a semiconductor nanowire having a monotonically increasing width with distance from a middle portion toward adjoining semiconductor pads is provided. A semiconductor link portion having tapered end portions is lithographically patterned. During the thinning process that forms a semiconductor nanowire, the taper at the end portions of the semiconductor nanowire provides enhanced mechanical strength to prevent structural buckling or bending. In another embodiment, a semiconductor nanowire having bulge portions are formed by preventing the thinning of a semiconductor link portion at pre-selected positions. The bulge portions having a greater width than a middle portion of the semiconductor nanowire provides enhanced mechanical strength during thinning of the semiconductor link portion so that structural damage to the semiconductor nanowire is avoided during thinning.

20 Claims, 20 Drawing Sheets

STRUCTURALLY STABILIZED SEMICONDUCTOR NANOWIRE

FIELD OF THE INVENTION

The present invention relates to semiconductor devices, and particularly to nanowires having enhanced structural stability and methods of manufacturing the same.

BACKGROUND OF THE INVENTION

A semiconductor nanowire refers to a semiconductor wire having transverse lateral and vertical dimensions of the order of a nanometer ($10^{-9}$ meter) or tens of nanometers. Typically, the transverse lateral dimension and the vertical dimension are less than 20 nm.

The limitation on the lateral dimension applies to the transverse lateral dimension (the width) and the vertical lateral dimension (the height). The longitudinal lateral dimension (the length) of the semiconductor nanowire is unlimited, and may be, for example, from 1 nm to 1 mm. When the lateral dimensions of the semiconductor nanowire is less than ten nanometers, quantum mechanical effects may become important.

A semiconductor nanowire enables enhanced control of the charge carriers along the lengthwise direction through a complete encirclement of the cross-sectional area of the semiconductor nanowire by a gate dielectric and a gate electrode. The charge transport along the semiconductor nanowire by the gate electrode is better controlled in a semiconductor nanowire device than in a fin field effect transistor (finFET) because of the complete encirclement of the semiconductor nanowire.

The transverse lateral dimension of a semiconductor nanowire is currently sublithographic, i.e., may not be printed by a direct image transfer from a photoresist that is patterned by a single exposure. As of 2008, the critical dimension, i.e., the smallest printable dimension that may be printed by lithographic methods, is about 35 nm. Dimensions less than the critical dimension are called sublithographic dimensions. At any given time, the critical dimension and the range of the sublithographic dimension are defined by the best available lithographic tool in the semiconductor industry. In general, the critical dimension and the range of the sublithographic dimension decreases in each successive technology node and established by a manufacturing standard accepted across the semiconductor industry.

To enable the transverse lateral dimension for a semiconductor nanowire, a thinning process is typically employed in which a semiconductor link portion formed by lithographic methods and having a lithographic transverse dimension is reduced in size by conversion of the outer portions of the semiconductor link portion. For example, a thermal oxidation of the semiconductor material constituting the semiconductor link portion may be employed to form a semiconductor nanowire having a sublithographic transverse lateral dimension.

Such thinning process generates significant level of stress and oftentimes results in structural breakdown of a semiconductor nanowire. However, structural stability of the semiconductor nanowire to form semiconductor nanowire devices with high yield.

SUMMARY OF THE INVENTION

The present invention provides a structurally reinforced semiconductor nanowire by providing at least one region having a greater width and attached to an end portion of a semiconductor nanowire.

In one embodiment, a semiconductor nanowire having a monotonically increasing width with distance from a middle portion toward adjoining semiconductor pads is provided. A semiconductor link portion having tapered end portions is lithographically patterned. During the thinning process that forms a semiconductor nanowire, the taper at the end portions of the semiconductor nanowire provides enhanced mechanical strength to prevent structural buckling or bending. In another embodiment, a semiconductor nanowire having bulge portions are formed by preventing the thinning of a semiconductor link portion at pre-selected positions. The bulge portions having a greater width than a middle portion of the semiconductor nanowire provides enhanced mechanical strength during thinning of the semiconductor link portion so that structural damage to the semiconductor nanowire is avoided during thinning.

According to an aspect of the present invention, a semiconductor structure is provided, which includes a semiconductor nanowire having a constant-width portion, a first end portion, and a second end portion, wherein the constant-width portion has a constant first initial width between the first end portion and the second end portion; a first semiconductor pad located on a substrate and adjoining the first end portion of the semiconductor nanowire, wherein the first end portion has a second initial width that is greater than the first initial width at an interface with the first semiconductor pad; and a second semiconductor pad located on the substrate and adjoining the second end portion of the semiconductor nanowire, wherein the second end portion has a first width that is greater than the second initial width at an interface with the second semiconductor pad.

According to another aspect of the present invention, a semiconductor structure is provided, which includes a semiconductor nanowire located over a substrate and having a first constant-width portion, a second constant-width portion, a third constant width portion, a first bulge portion, and a second bulge portion located over the substrate, wherein the first bulge portion is located between, and directly adjoins, i.e., laterally abuts, the first constant-width portion and the second constant width portion, wherein the second bulge portion is located between, and directly adjoins, the first constant width portion and the third constant width portion, wherein the first, second, and third constant width portions have a first initial width, and wherein the first and second bulge portions have a second initial width that is greater than the first initial width.

According to yet another aspect of the present invention, a method of forming a semiconductor structure is provided, which includes: forming a semiconductor link portion laterally adjoined by a first semiconductor pad and a second semiconductor pad on a substrate, wherein the semiconductor link portion includes a middle portion having a constant width, a first end portion that is wider than the middle portion at an interface with the first semiconductor pad, and a second end portion that is wider than the middle portion at an interface with the second semiconductor pad; converting exposed semiconductor material of the semiconductor link portion and the first and second semiconductor pads into a dielectric material; and removing the dielectric material, wherein a semiconductor nanowire having a constant-width portion, a first end portion, and a second end portion is formed by a remaining portion of the semiconductor link portion.

According to still another aspect of the present invention, a method of forming a semiconductor structure is provided, which includes: forming a semiconductor link portion having a constant width and laterally adjoined by a first semiconductor pad and a second semiconductor pad on a substrate; forming two oxidation barrier portions over sub-portions of the semiconductor link portion; forming oxidized material portions by converting exposed portions of the semiconductor link portion into a semiconductor oxide, wherein the two oxidation barrier portions prevent oxidation of the sub-portions; and removing the oxidized material portions, wherein remaining portions of the semiconductor link portion constitutes a semiconductor nanowire including three constant-width portions separated by two bulge portions having a greater width than the three constant-width portions.

DETAILED DESCRIPTION OF THE INVENTION

Figure 1A:
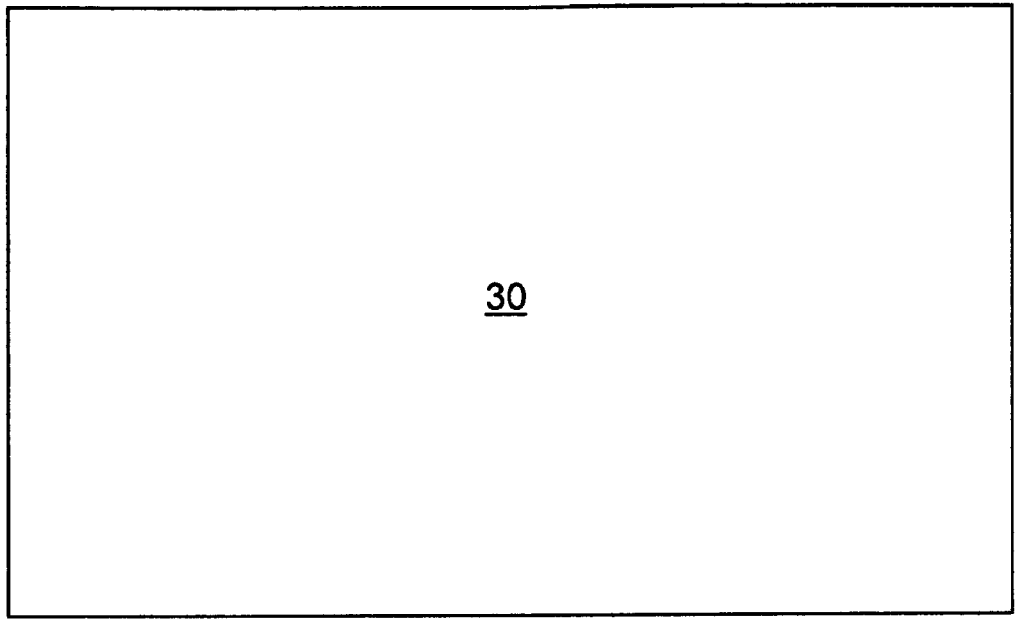
FIG. 1A is a top-down view of a first exemplary semiconductor structure when provided as a semiconductor-on-insulator (SOI) substrate.

As stated above, the present invention relates to nanowires having enhanced structural stability and methods of manufacturing the same, which are now described in detail with accompanying figures. It is noted that like and corresponding elements are referred to by like reference numerals.

Figure 1B:
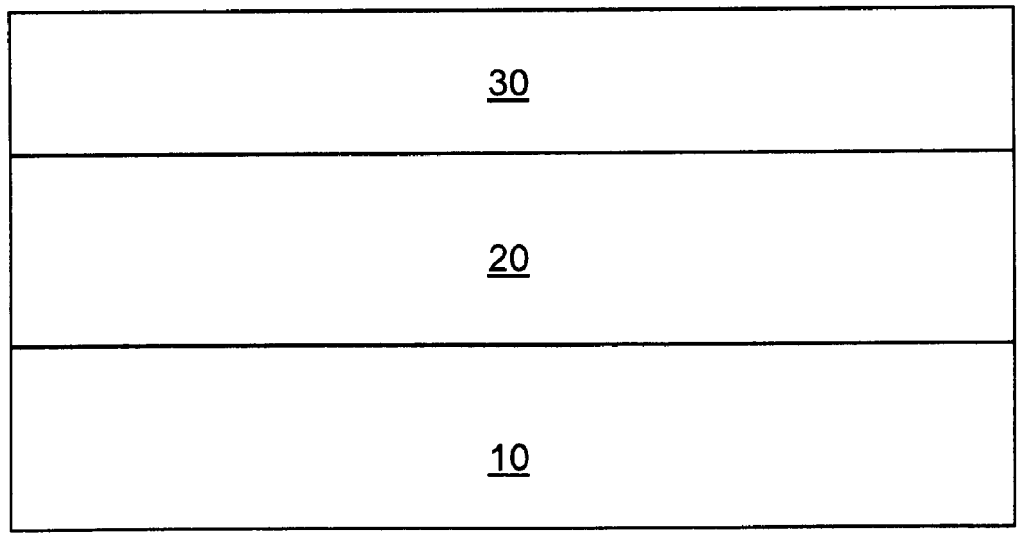
FIG. 1B is a vertical cross-sectional view of the exemplary semiconductor structure along the plane B-B' at the step corresponding to FIG. 1A.

Referring to FIGS. 1A and 1B, a first exemplary semiconductor structure according to the first embodiment of the present invention includes a semiconductor-on insulator (SOD substrate which contains a handle substrate 10, a buried insulator layer 20, and a top semiconductor layer 30. The top semiconductor layer 30 comprises a semiconductor material, which may be selected from, but is not limited to silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. In one case, the top semiconductor layer 30 may include a Si-containing semiconductor material such as single crystalline silicon or a single crystalline silicon-germanium alloy.

Preferably, the entirety of the semiconductor material within the top semiconductor layer 30 is single crystalline material, i.e., has an epitaxial atomic alignment throughout. In this case, the crystallographic orientation of the surface normal of the top surface of the top semiconductor layer 30 is herein referred to as a surface orientation of the top surface of the top semiconductor layer 30. While the top surface of the top semiconductor layer 30 may be any crystallographic orientation, a major crystallographic orientation with low Miller indices are typically selected for the surface orientation of the top surface of the top semiconductor layer. It is preferred that the surface orientation for the top surface of the top semiconductor layer 30 is one of the surface orientations at which either hole mobility or electron mobility is at maximum at least locally, and preferably globally. The thickness of the top semiconductor layer 30 may be from 10 nm to 200 nm, although lesser and greater thicknesses are also contemplated herein.

The top semiconductor layer 30 may be doped with electrical dopants as needed. For example, the top semiconductor layer 30 may be doped with dopants of a first conductivity type, which may be p-type or n-type. Typically, the dopant concentration in top semiconductor layer 30 is in the range from $5.0 \times 10^{14}/cm^3$ to $3.0 \times 10^{17}/cm^3$, although lesser and greater dopant concentrations are also contemplated herein.

The buried insulator layer 20 is a dielectric material layer, i.e., a layer including a dielectric material. The dielectric material of the buried insulator layer 20 may be, for example, silicon oxide, silicon nitride, silicon oxynitride, quartz, a ceramic material, or a combination thereof. The thickness of the buried insulator layer 20 may be from 50 nm to 1,000 nm, although lesser and greater thicknesses are also contemplated herein. The handle substrate 10 may comprise a semiconductor material, an insulator material, or a conductive material. In some cases, the handle substrate 10 and the buried insulator layer 20 may comprise the same dielectric material and may be of unitary and integral construction.

Figure 2A:
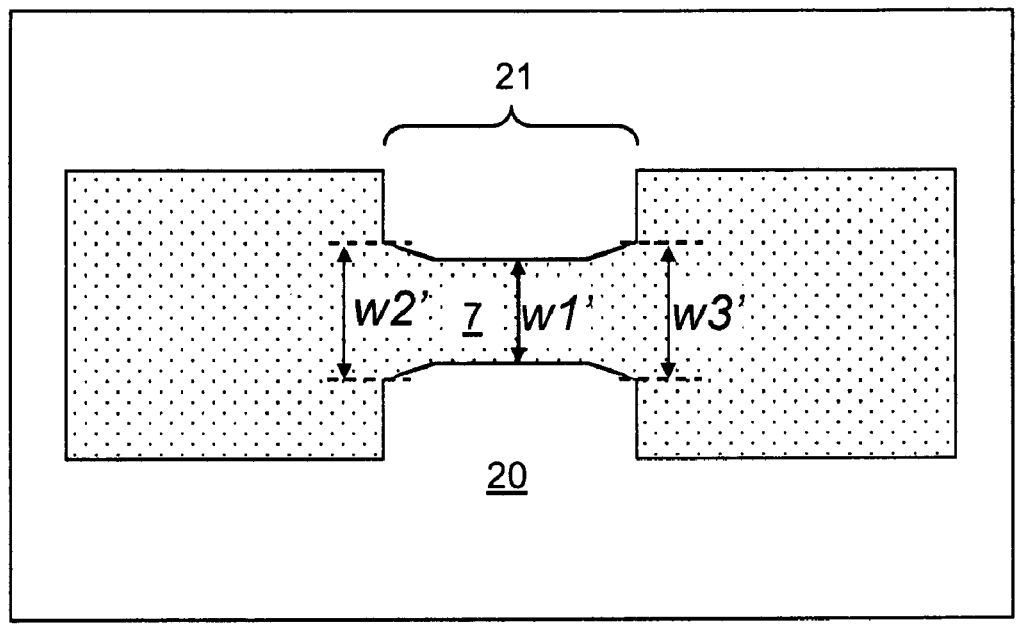
FIG. 2A is a top-down view of the first exemplary semiconductor structure after patterning of a semiconductor link portion and semiconductor pads.
Figure 2B:
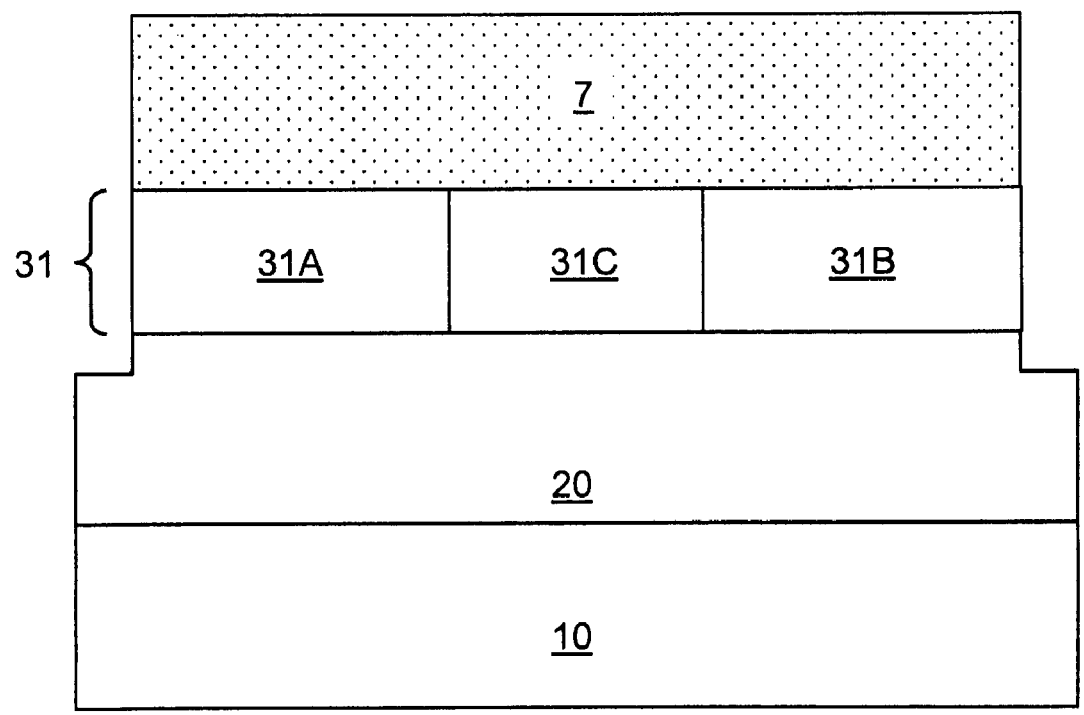
FIG. 2B is a vertical cross-sectional view of the exemplary semiconductor structure along the plane B-B' at the step corresponding to FIG. 2A.

Referring to FIGS. 2A and 2B, a photoresist 7 is applied to the top surface of the top semiconductor layer 30 and is lithographically patterned. The photoresist 7 as patterned includes a photoresist link portion 21 having a constant-width middle portion and two end portions. The two end portions have monotonically increasing widths with distance from the constant-width middle portion, i.e., the width of the two end portions are non-decreasing with distance from the constant-width portion. The width of the constant-width middle portion of the photoresist 7 is herein referred to as a first initial width w1'. A first end portion of the photoresist link portion 21 has a first maximum width, which is herein referred to as a second initial width w2', and the second end portion of the photoresist link portion 21 has a second maximum width, which is herein referred to as a third initial width w3'. The second initial width w2' may be the same as, or different from, the third initial width w3'. The first initial Width w1' is a lithographic dimension, i.e., a dimension that may be printed with a single lithographic exposure. Thus, the first initial width w1' is greater than 40 nm, while it is contemplated that a lesser first initial width w1' may be formed as lithography tools improve in the future. Typically, the first initial width w1' is a critical dimension, i.e., lithographically printable minimum dimension, or a dimension close to the critical dimension.

The photoresist link portion is laterally adjoined by a first pad shape and a second pad shape, which have wider widths than the photoresist link shape. The lengthwise direction of the photoresist link portion, which is horizontal and is perpendicular to the direction of the first initial width w1', is herein referred to as a first horizontal direction.

The width in the end portions of the photoresist link portion 21 may strictly increase with distance from the constant-width portion of the photoresist link portion 21. In the case of the strict increase with distance, the greater the value of distance from the constant-width portion, the greater the width of the end portions of the photoresist link portion 21 for every pair of values for distance selected in a given end portion of the photoresist link portion 21. In one case, the end portions of the photoresist link portion 21 have trapezoidal shapes in a top-down view.

The pattern in the photoresist 7 is transferred into the top semiconductor layer 30 and an upper portion of the buried insulator layer 20, for example, by an anisotropic etch. The exposed portions of the top semiconductor layer 30 and the upper portions of the buried insulator layer 20 directly underneath are removed by the anisotropic etch. The remaining portions of the top semiconductor layer 30 constitute a semiconductor link structure 31. The semiconductor link structure includes a semiconductor link portion 31C, a first prototype semiconductor pad 31A laterally abutting the semiconductor link portion 31C on one side, and a second prototype semiconductor pad 31B laterally abutting the semiconductor link portion 31C on an opposite side.

The exposed sidewalls of the semiconductor link structure 31 are substantially vertically coincident with the sidewalls of the photoresist 7. Further, the sidewalls of the patterned portions of the buried insulator layer 20 are substantially vertically coincident with the sidewalls of the photoresist 7 and the sidewalls of the semiconductor link structure 31. The photoresist 7 is subsequently removed, for example, by ashing.

Figure 3A:
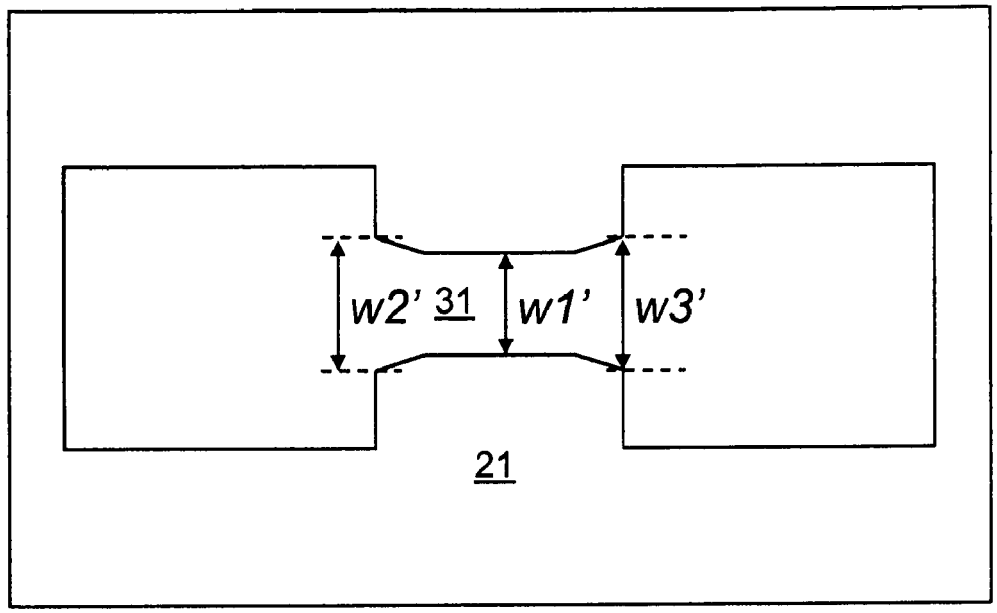
FIG. 3A is a top-down view of the first exemplary semiconductor structure after formation of dielectric pedestals.
Figure 3B:
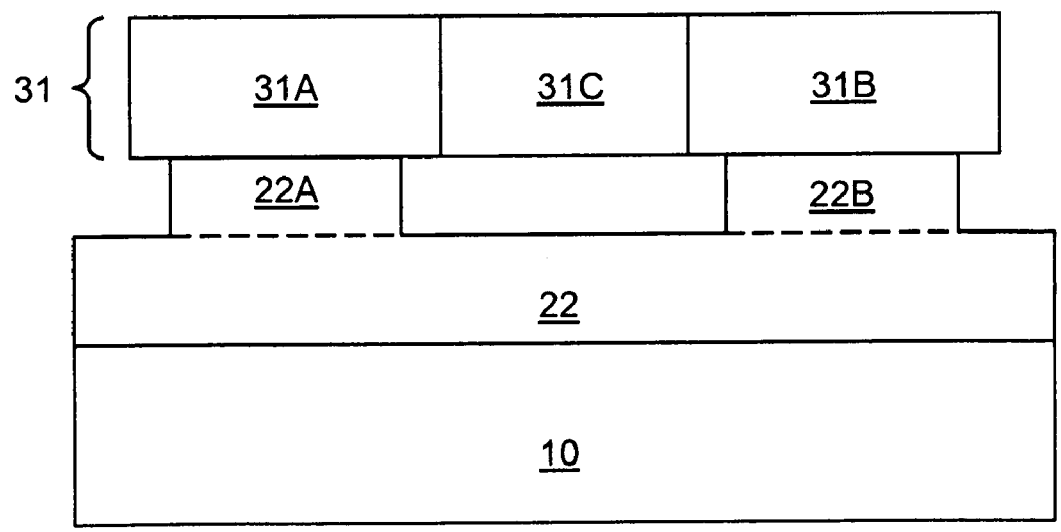
FIG. 3B is a vertical cross-sectional view of the exemplary semiconductor structure along the plane B-B' at the step corresponding to FIG. 3A.

Referring to FIGS. 3A and 3B, a substantially isotropic etch is performed on the dielectric material of the buried insulator layer 20 selective to the semiconductor material of the semiconductor link structure 31. The semiconductor link structure 31 is employed as an etch mask for the substantially isotropic etch. The substantially isotropic etch may be a wet etch or a dry etch. Because the etch is substantially isotropic, the edges of the semiconductor link structure 31 are undercut as the etch progresses. The etch proceeds at least until the portions of the buried insulator layer 20 located directly underneath the semiconductor link structure 31 are removed so that the semiconductor link portion 31C become suspended over the remaining portions of the buried insulator layer 20. In other words, the semiconductor link portion 31C does not have direct physical contact with the remaining portions of the buried insulator layer 20, which is herein referred to as a dielectric material layer 22, after the etch.

The etch also removes the dielectric material of the buried insulator layer 20 from underneath the peripheral portions of the first and second prototype semiconductor pads (31A, 31B). A first dielectric pedestal 22A comprising a remaining portion of the buried insulator layer 20 is formed directly underneath a center portion of the first prototype semiconductor pad 31A. Likewise, a second dielectric pedestal 22B is formed directly underneath a center portion of the second prototype semiconductor pad 31B. As the dielectric material is etched from underneath peripheral portions of the semiconductor link structure 31 employing the semiconductor link structure 31 as an etch mask, the buried insulator layer 20, which is a dielectric material layer, is undercut beneath the semiconductor link structure 31.

The semiconductor link portion 31C is suspended over a remaining portion of the buried insulator layer 20, which is the dielectric material layer 22. The first and second dielectric pedestals (22A, 22B) are integrally formed with the dielectric material layer 22, and are portions of the dielectric material layer 22. The semiconductor link structure 31 contacts the dielectric material layer 22, which incorporates the first and second dielectric pedestals (22A, 22B), at bottom surfaces of the first and second prototype semiconductor pads (31A, 31B). The semiconductor link portion 31C has a pair of sidewalls that are separated by the first initial width w1'.

Figure 4A:
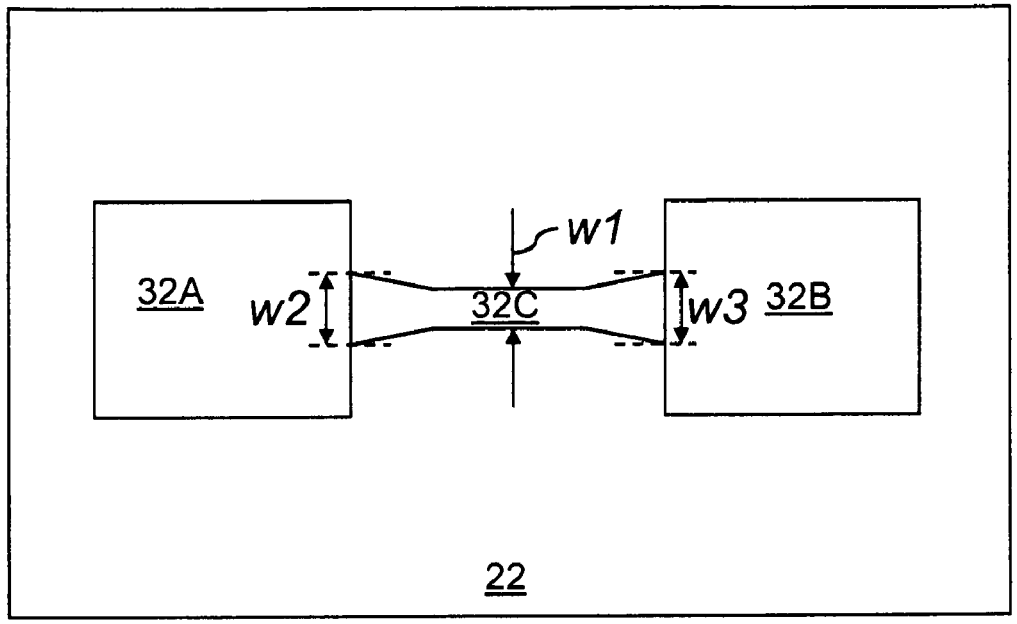
FIG. 4A is a top-down view of the first exemplary semiconductor structure after formation of a semiconductor nanowire.
Figure 4B:
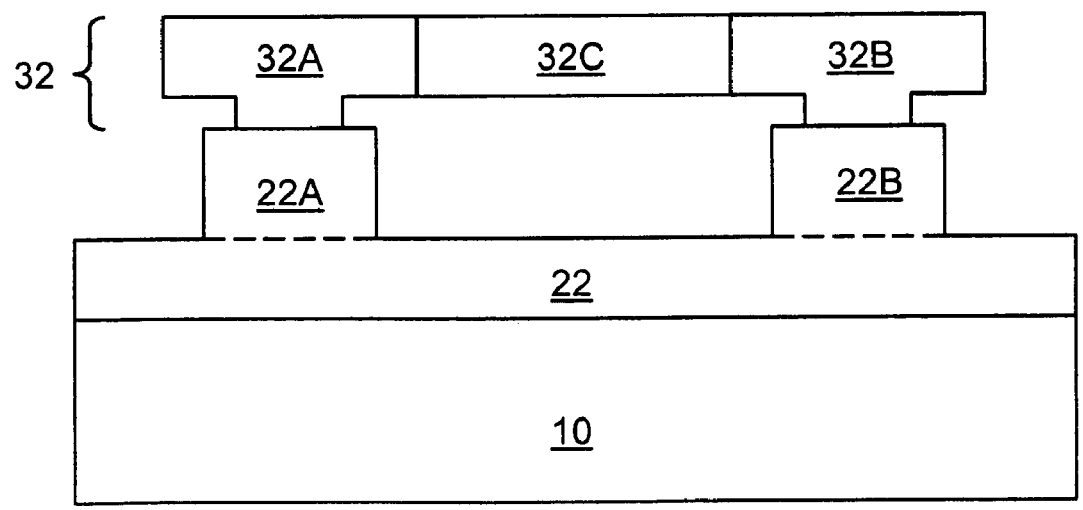
FIG. 4B is a vertical cross-sectional view of the exemplary semiconductor structure along the plane B-B' at the step corresponding to FIG. 4A.

Referring to FIGS. 4A and 4B, the semiconductor link structure 31 is thinned, i.e., dimensions of the semiconductor link structure 31 are reduced, for example, by oxidation. Specifically, exposed peripheral portions of the semiconductor link structure 31 including the semiconductor link portion 31C is converted into oxide material portions by oxidation. The semiconductor oxide material is subsequently removed by an isotropic etch such as a wet etch. For example, if the semiconductor link structure 31 includes silicon, the semiconductor oxide material may be silicon oxide, which may be removed by hydrofluoric acid (HF). Alternately, an isotropic wet etch or an isotropic dry etch may be employed to thin the semiconductor link structure 31 by removing the exposed outer portions of the semiconductor material.

The remaining portions of the semiconductor link structure 31 is herein referred to as a semiconductor nanowire structure 32, which includes a first semiconductor pad 32A, a second semiconductor pad 32B, and a semiconductor nanowire 32C. The first semiconductor pad 32A and the second semiconductor pad 32B laterally abut the semiconductor nanowire 32C.

The middle portion of the semiconductor nanowire 32C has a rectangular vertical cross-sectional area in a plane perpendicular to the first horizontal direction. The width of the middle portion of the semiconductor nanowire 32C, which is the dimension of the semiconductor nanowire 32C in the widthwise direction between the pair of sidewalls as recessed by the thinning, is herein referred to as a first width w1. The first width w1 is less than the first initial width w1' because the semiconductor material is consumed during the thinning process. Preferably, the first width w1 is a sublithographic dimension, i.e., a dimension that is less than the smallest dimension that may be printed with a single lithographic exposure on a photoresist. Typically, the first width w1 is from 1 nm to 20 nm, although lesser and greater dimensions are also contemplated herein. Preferably, the first width w1 is from 2 nm to 10 nm.

The maximum width of the first end portion of the semiconductor nanowire 32C at an interface with the first semiconductor pad 32A is herein referred to as a second width w2, and the maximum width of the second end portion of the semiconductor nanowire 32C at an interface with the second semiconductor pad 32B is herein referred to as a third width w3. The second width w2 is less than the second initial width w2', and the third width w3 is less than the third initial width w3'. The second width w2 and the third width w3 are greater than the first width w1. The second width w2 and the third width w3 may be sublithographic dimensions or lithographic dimensions or a combination thereof. Typically, the second width w2 and the third width w3 are from 2 nm to 100 nm, although lesser and greater dimensions are also contemplated herein. The shapes of the first and second end portions of the semiconductor nanowire 32C may be trapezoids as seen in a top-down view. The entirety of the semiconductor nanowire structure 32 may have the same thickness, which may be from 1 nm to 40 nm, and is typically from about 2 nm to about 20 nm, although lesser and greater thicknesses are also contemplated herein.

Figure 5A:
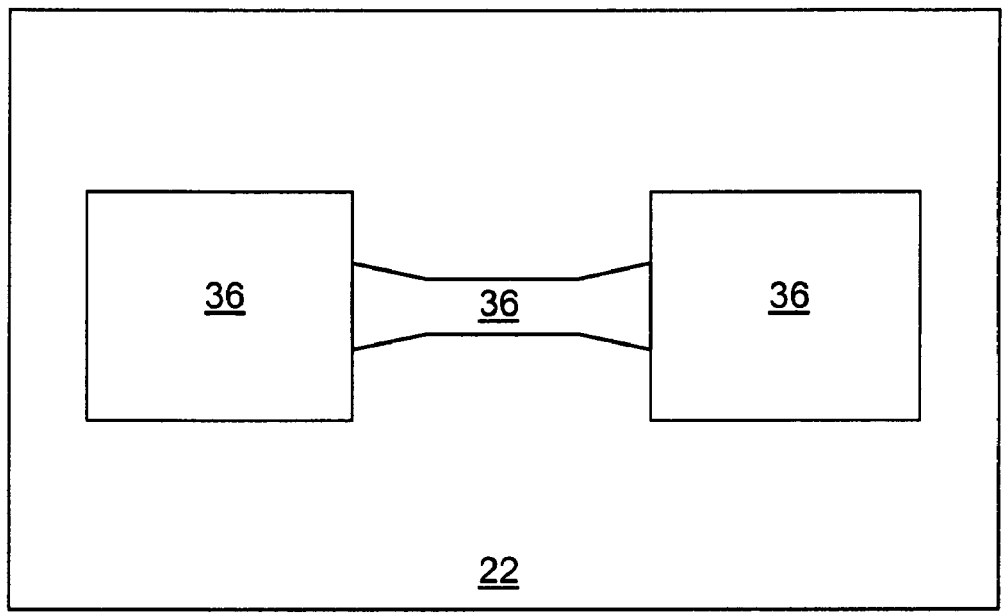
FIG. 5A is a top-down view of the first exemplary semiconductor structure after formation of a gate dielectric.

Referring to FIGS. 5A and 5C, a gate dielectric 36 is formed on the exposed surfaces of the semiconductor nanowire structure 32. In one case, the gate dielectric 36 and comprises a dielectric material formed by thermal conversion of outer portions of the semiconductor nanowire structure 32 such as silicon oxide or silicon nitride. Thermal oxidation, thermal nitridation, plasma oxidation, plasma nitridation, or a combination thereof may be employed to form the gate dielectric 36. In this case, the gate dielectric 36 is formed only on the surfaces of the semiconductor nanowire structure 32. The thickness of the gate dielectric 36 may be from about 0.8 nm to about 10 nm, and is typically from about 1.1 nm to about 6 nm.

In another case, the gate dielectric 36 may comprise a high-k dielectric material having a dielectric constant greater than 3.9, i.e., the dielectric constant of silicon oxide. The high-k dielectric material may comprise a dielectric metal oxide containing a metal and oxygen. Preferably, the dielectric constant of the high-k material is greater than or about 4.0. More preferably, the dielectric constant of the high-k dielectric material is greater than the dielectric constant of silicon nitride, which is about 7.5. Even more preferably, the dielectric constant of the high-k dielectric material is greater than 8.0. The high-k dielectric materials are also known in the art as high-k gate dielectric materials, which include dielectric metal oxides, alloys thereof, and silicate alloys thereof. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from about 0.5 to about 3 and each value of y is independently from 0 to about 2. Optionally, an interfacial layer (not shown), for example, silicon oxide, can be formed by chemical oxidation or thermal oxidation before the high-k dielectric material is deposited. In this case, the gate dielectric 36 may be formed as a single contiguous gate dielectric layer covering the entirety of the top surfaces and sidewall surfaces of the semiconductor nanowire structure 32 and all exposed surfaces of the dielectric material layer 22 including the first and second dielectric pedestals (22A, 22B). In this case, the thickness of the gate dielectric 36 may be from about 1 nm to about 6 nm, and may have an effective oxide thickness on the order of or less than 1 nm.

Figure 5B:
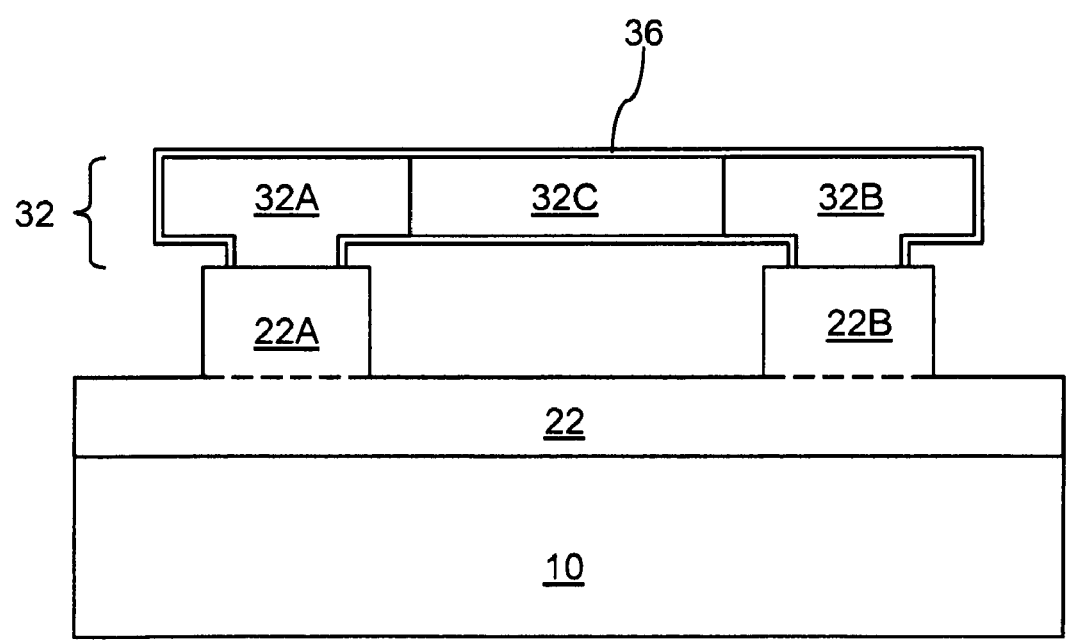
FIG. 5B is a vertical cross-sectional view of the exemplary semiconductor structure along the plane B-B' at the step corresponding to FIG. 5A.
Figure 6A:
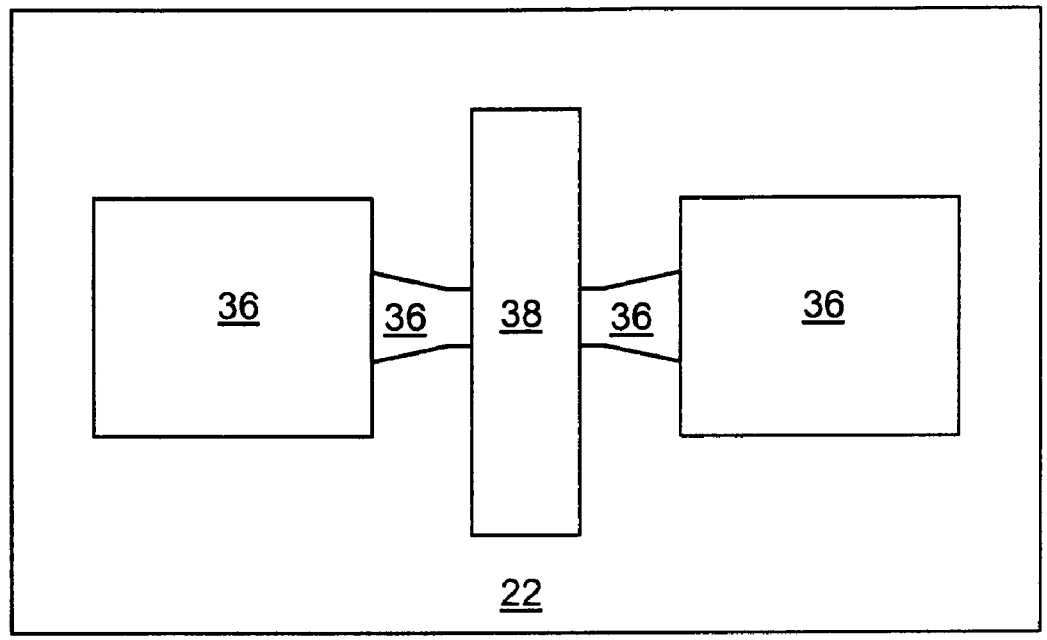
FIG. 6A is a top-down view of the first exemplary semiconductor structure after formation of a gate electrode.
Figure 6B:
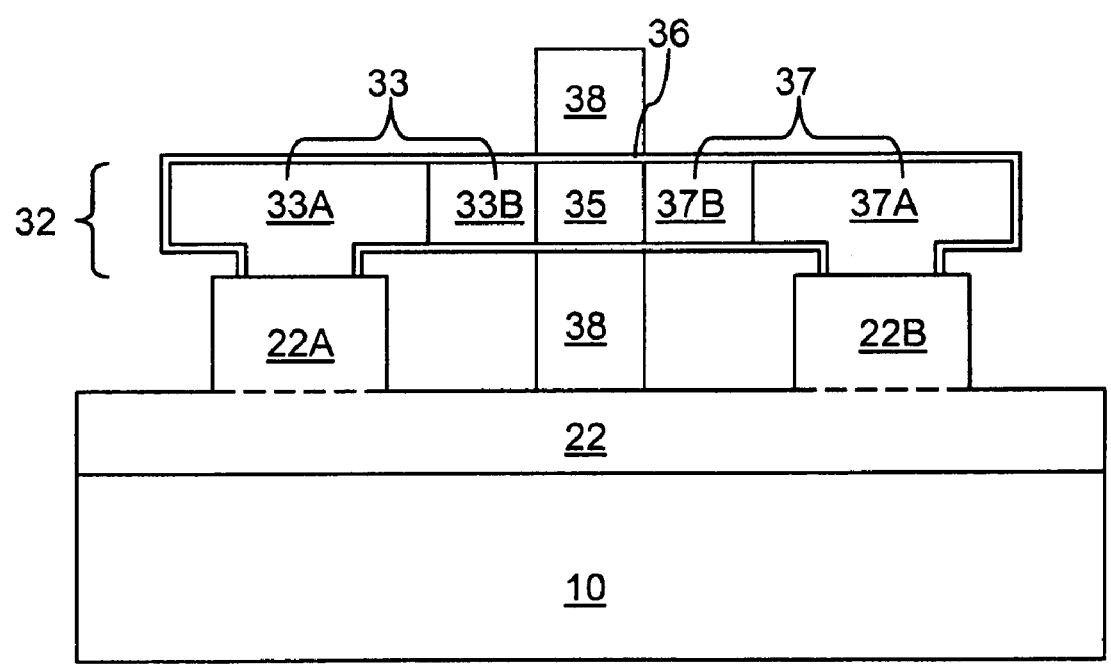
FIG. 6B is a vertical cross-sectional view of the exemplary semiconductor structure along the plane B-B' at the step corresponding to FIG. 6A.

Referring to FIGS. 6A and 6B, a gate electrode 38 is formed on and around a middle portion of the semiconductor nanowire 32C (See FIG. 5B). The gate electrode 38 comprises a conductive material such as a doped semiconductor material, a metal, a metallic alloy, a conductive compound of at least one metal, or combinations thereof. Preferably, the thickness of the deposited gate electrode material exceeds half the distance between the semiconductor nanowire (32C; See FIG. 5B) and the dielectric material layer 22 so that the gate electrode 38 contains only one hole within which the semiconductor nanowire 32C is located.

In one embodiment, the gate electrode 38 may comprise an amorphous or polycrystalline semiconductor material such as polysilicon, amorphous silicon, a silicon-germanium alloy, a silicon-carbon alloy, a silicon-germanium-carbon alloy, or a combination thereof. The gate electrode 38 may be in-situ doped, or may be doped by a subsequent ion implantation of dopant ions.

Alternately or additionally, at least one of the gate electrode 38 may comprise a metal gate material, which comprises a metallic conductive material. For example, the gate electrode 38 may comprise a material such as TaN, TiN, WN, TiAlN, TaCN, other conductive refractory metal nitride, or an alloy thereof. The metal gate material may be formed by chemical vapor deposition (CVD), physical vapor deposition (PVD), atomic layer deposition (ALD), etc. and comprising a conductive refractory metal nitride. In case the gate dielectric 36 comprises a high-k gate dielectric material, the metal gate material may be formed directly on the gate dielectric 36. The composition of the metal gate material may be selected to optimize threshold voltages of semiconductor devices to be subsequently formed in the semiconductor nanowire structure 32. The gate electrodes 38 may include both a metal gate material and a semiconductor material.

Optionally, dielectric spacers (not shown) may be formed on the sidewalls of the gate electrode 38 as needed, for example, to control the overlap between the gate electrode 38 and source and drain regions of semiconductor nanowire transistor to be formed.

Dopants of the second conductivity type are implanted into portions of the semiconductor nanowire structure 32 employing the gate electrode 38 as an ion implantation mask. The first semiconductor pad 32A and the second semiconductor pad 32B are doped with dopants of the second conductivity type, which are herein referred to as a pad source portion 33A and a pad drain portion 37A. The pad source portion 33A is the first semiconductor pad 32A, and the pad drain portion 37A is the second semiconductor pad 32B. One end of the semiconductor nanowire 32C (See FIG. 5B) abutting the pad source portion 33A is also doped with dopants of the second conductivity type and is herein referred to as a nanowire source portion 33B. The pad source portion 33A and the nanowire source portion 33B have a doping of the second conductivity type and are collectively called a source region 33. The other end of the semiconductor nanowire 32C (See FIG. 5B) abutting the pad drain portion 37A is also doped with dopants of the second conductivity type and is herein referred to as a nanowire drain portion 37B. The pad drain portion 37A and the nanowire drain portion 37B have a doping of the second conductivity type and are collectively called a drain region 37. The middle portion of the semiconductor nanowire 32C (See FIG. 5B) that is not implanted with dopants of the second conductivity type has a doping of the first conductivity type, and is herein referred to as a first channel region 35. The first channel region 35 laterally abuts the source region 33 and the drain region 37. The first channel region 35, the source region 33, the drain region 37, the gate dielectric 36, and the gate electrode 38 collectively constitute a semiconductor nanowire transistor that controls the flow of current through the semiconductor nanowire (35, 33B, 37B).

Preferably, the interface between the channel region 35 and the nanowire source portion 33B is within the portion of the semiconductor nanowire (35, 33B, 37B) having the first width w1. Similarly, the interface between the channel region 35 and the nanowire source portion 33B is preferably within the portion of the semiconductor nanowire (35, 33B, 37B) having the first width w1. Positioning the p-n junctions within the portion of the semiconductor nanowire (35, 33B, 37B) having the first width w1 provides well controlled device characteristics for the semiconductor nanowire transistor that is formed on the semiconductor nanowire (35, 33B, 37B).

Figure 7A:
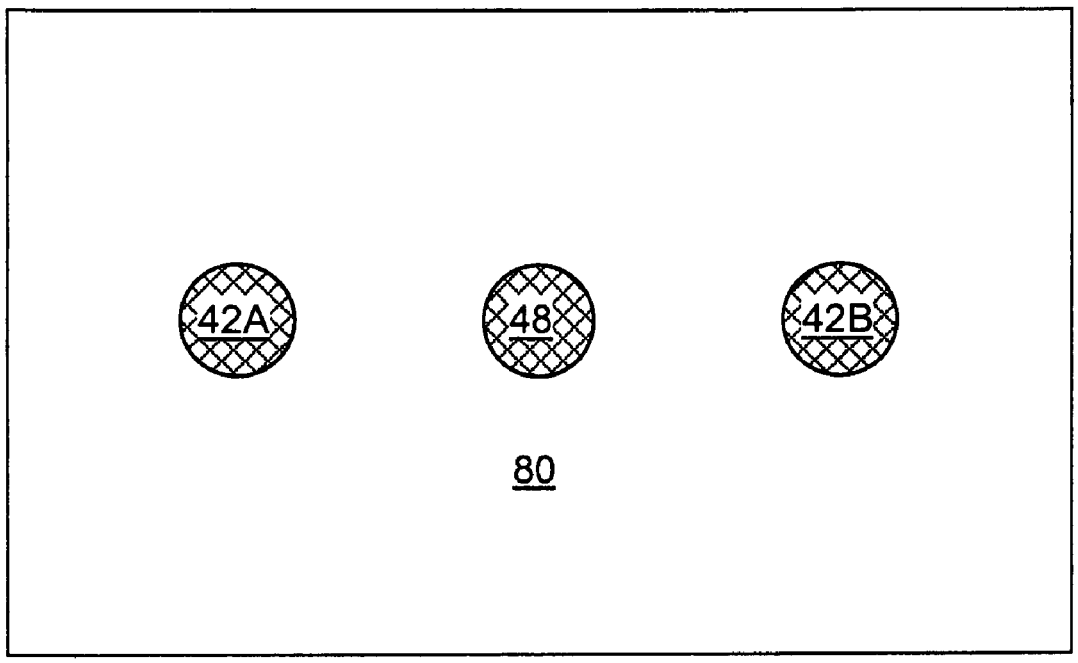
FIG. 7A is a top-down view of the first exemplary semiconductor structure after formation of a middle-of-line (MOL) dielectric layer and contact vias.
Figure 7B:
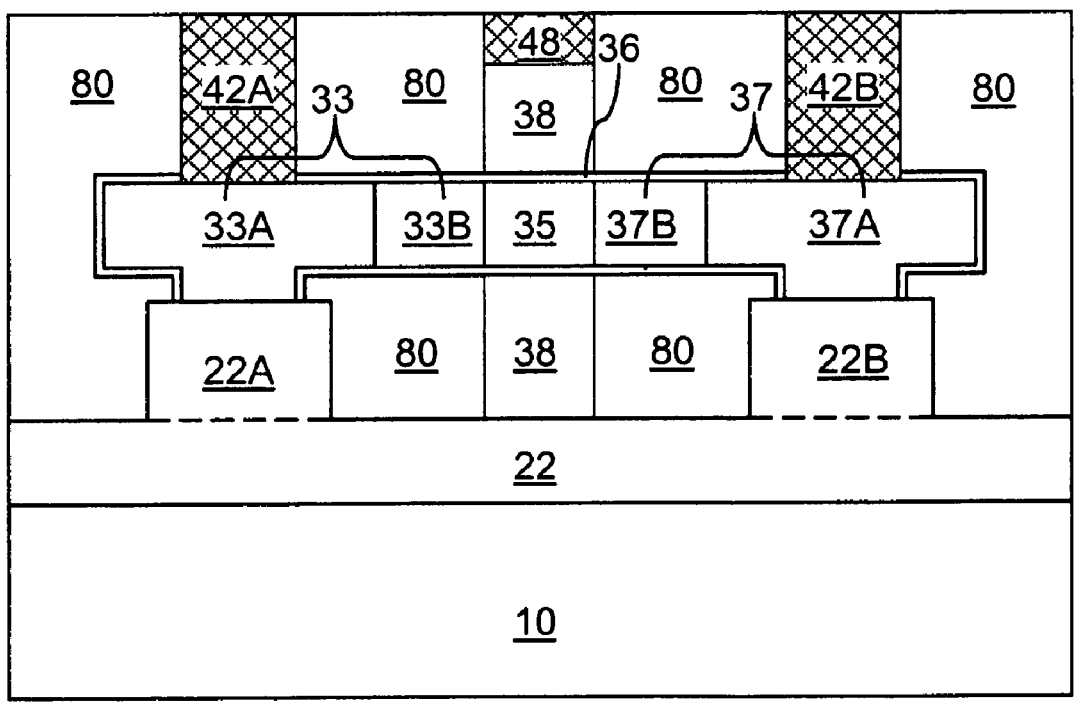
FIG. 7B is a vertical cross-sectional view of the exemplary semiconductor structure along the plane B-B' at the step corresponding to FIG. 7A.

Referring to FIGS. 7A and 7B, a middle-of-line (MOL) dielectric material layer 80 is formed over the first and second semiconductor nanowire transistors. The MOL dielectric material layer 80 may include a mobile ion diffusion barrier layer (not shown) which comprises a material that blocks the diffusion of mobile ions such as Na+ and K+. Typical material employed for the mobile ion diffusion barrier layer includes silicon nitride. The MOL dielectric material layer 80 may include for example, a CVD oxide, spin-on low dielectric constant material having a dielectric constant less than 2.8, an organosilicate glass or a CVD low dielectric material having a dielectric Constant less than 2.8, or any other dielectric material that may be employed for a back-end-of-line (BEOL) dielectric layer in metal interconnect structures. For example, The CVD oxide may be an undoped silicate glass (USG), borosilicate glass (BSG), phosphosilicate glass (PSG), fluorosilicate glass (FSG), borophosphosilicate glass (BPSG), or a combination thereof. The MOL dielectric layer 80 fills the spaces between the dielectric material layer 22 and the first and second semiconductor nanowire (35, 33B, 37B, 55, 53B, 57B).

Various contact via holes are formed in the MOL dielectric layer 80 and filled with a conductive material to from various contact vias. Specifically, a source-side contact via 42A is formed directly on the pad source portion 33A, a drain-side contact via 42B is formed directly on the pad drain portion 37A, a first gate-side contact via 48 is formed directly on the gate electrode 38. Likewise, a second source-side contact via 62A is formed directly on the second pad source portion 53A, a second drain-side contact via 62B is formed directly on the second pad drain portion 57A, a second gate-side contact via 68 is formed directly on the second gate electrode 58. The top surfaces of the MOL dielectric layer 80, the source-side contact via 42A, the drain-side contact via 42B, the first gate-side contact via 48, the second source-side contact via 62A, the second drain-side contact via 62B, and the second gate-side contact via 68 may be substantially coplanar after planarization of the MOL dielectric layer 80 and removal of the excess conductive material. Additional metal interconnect structures (not shown) including a first level metal wiring (not shown) may be formed above the MOL dielectric layer 80.

Figure 8A:
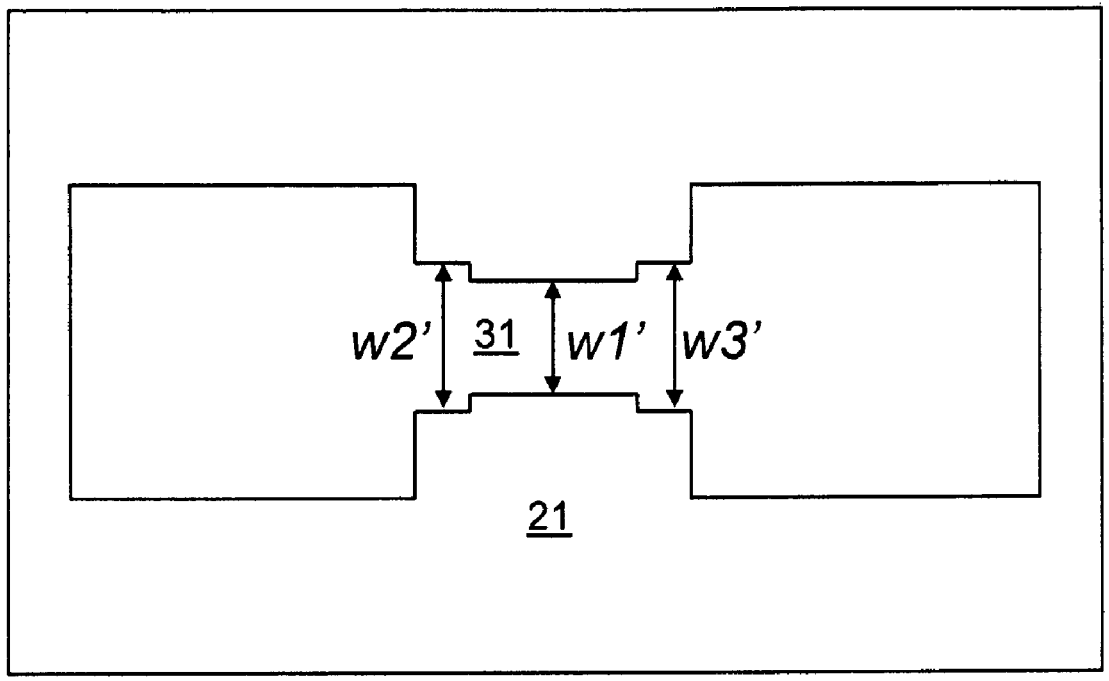
FIG. 8A is a top-down view of a second exemplary semiconductor structure after formation of a semiconductor link portion, semiconductor pads, and dielectric pedestals.
Figure 8B:
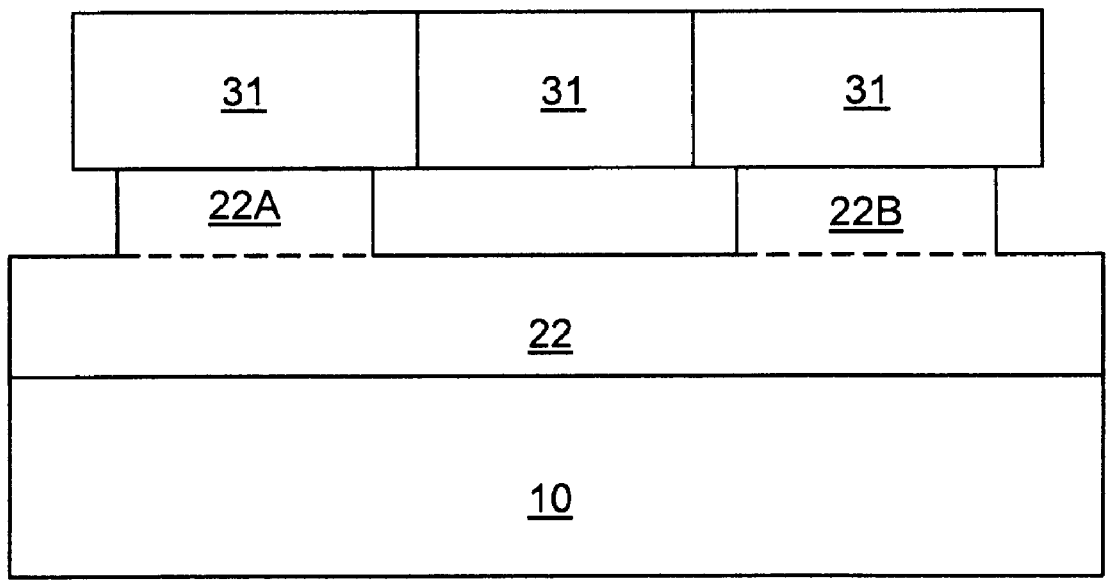
FIG. 8B is a vertical cross-sectional view of the exemplary semiconductor structure along the plane B-B' at the step corresponding to FIG. 8A.

Referring to FIGS. 8A and 8B, a second exemplary semiconductor structure according to a second embodiment of the present invention is derived from the first exemplary semiconductor structure of FIGS. 1A and 1B by employing the processing steps of FIGS. 2A, 2B, 3A, and 3B. The pattern in the photoresist 7 (See FIGS. 2A and 2B) is modified to include a constant-width middle portion and two end portions. The two end portions have constant widths that are greater than the width of the constant-width middle portion. The width of the constant-width middle portion is herein referred to as a first initial width w1', which is transferred into the top semiconductor layer 30 by an anisotropic etch. The first end portion of the photoresist link portion has a second initial width w2', and the second end portion of the photoresist link portion has a third initial width w3'. The second initial width w2' may be the same as, or different from, the third initial width w3'. The first initial width w1' is a lithographic dimension, i.e., a dimension that may be printed with a single lithographic exposure. Thus, the first initial width w1' is greater than 40 nm, while it is contemplated that a lesser first initial width w1' may be formed as lithography tools improve in the future. Typically, the first initial width w1' is a critical dimension, i.e., lithographically printable minimum dimension, or a dimension close to the critical dimension.

The pattern in the photoresist is transferred into the top semiconductor layer 30 and an upper portion of the buried insulator layer 20 as in the first embodiment. The remaining portions of the top semiconductor layer 30 constitute a semiconductor link structure 31. The semiconductor link structure includes a semiconductor link portion 31C, a first prototype semiconductor pad 31A laterally abutting the semiconductor link portion 31C on one side, and a second prototype semiconductor pad 31B laterally abutting the semiconductor link portion 31C on an opposite side. The exposed sidewalls of the semiconductor link structure 31 are substantially vertically coincident with the sidewalls of the photoresist 7. Further, the sidewalls of the patterned portions of the buried insulator layer 20 are substantially vertically coincident with the sidewalls of the photoresist 7 and the sidewalls of the semiconductor link structure 31. The photoresist 7 is subsequently removed, for example, by ashing.

As in the first embodiment, the semiconductor link portion 31C is suspended over a remaining portion of the buried insulator layer 20, which is the dielectric material layer 22 after a substantially isotropic etch. The first and second dielectric pedestals (22A, 22B) are integrally formed with the dielectric material layer 22, and are portions of the dielectric material layer 22. The semiconductor link structure 31 contacts the dielectric material layer 22, which incorporates the first and second dielectric pedestals (22A, 22B), at bottom surfaces of the first and second prototype semiconductor pads (31A, 31B). The semiconductor link portion 31C has a first pair of sidewalls that are separated by the first initial width w1', a second pair of sidewalls that are separated by the second initial width w2', and a third pair of sidewalls that are separated by the third initial width w3'.

Figure 9A:
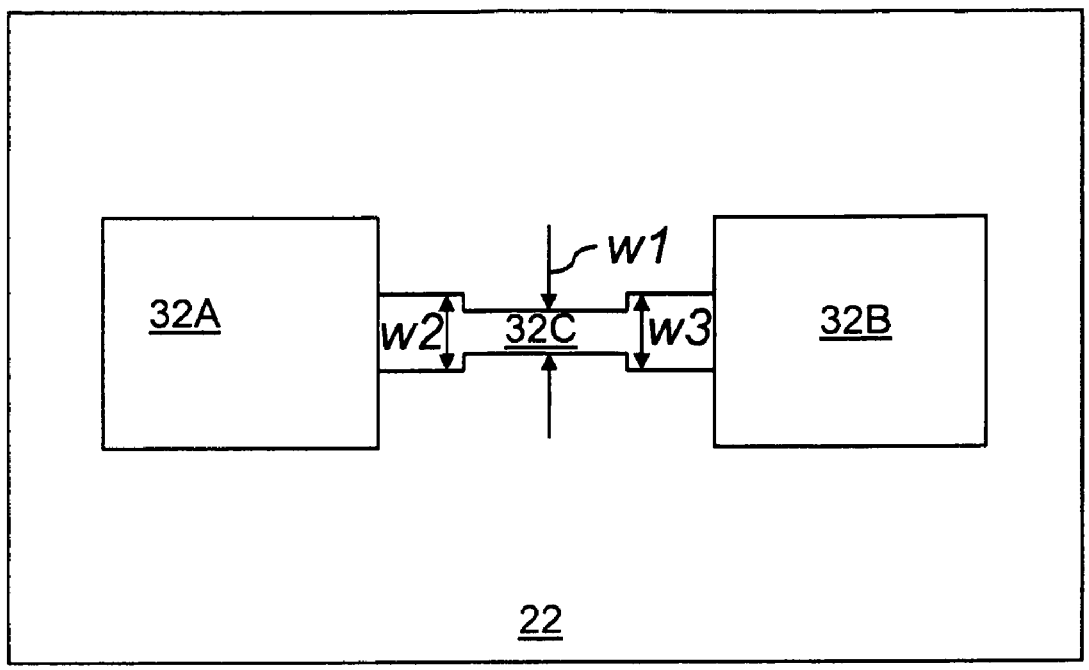
FIG. 9A is a top-down view of the second exemplary semiconductor structure after formation of a semiconductor nanowire.
Figure 9B:
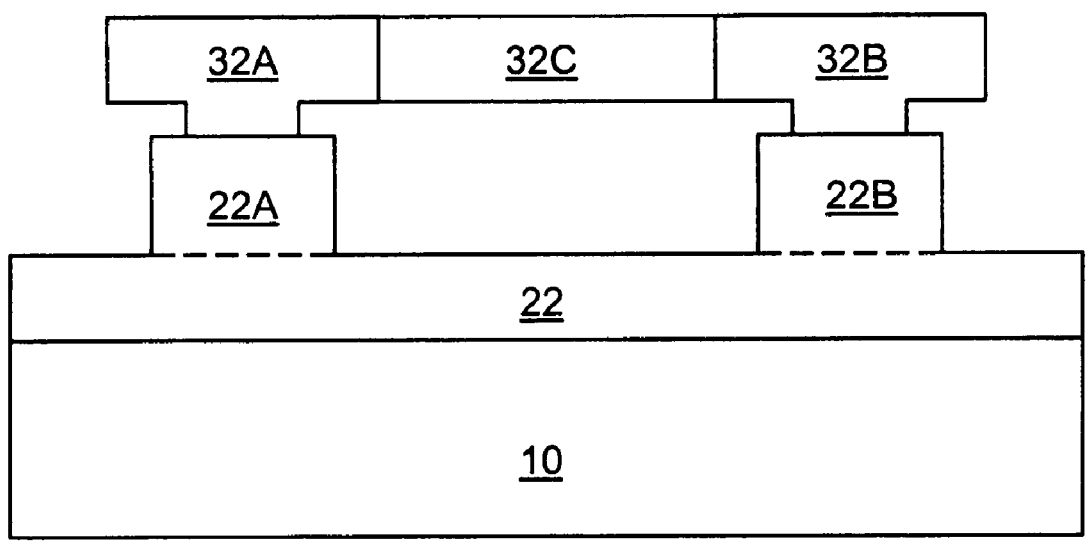
FIG. 9B is a vertical cross-sectional view of the exemplary semiconductor structure along the plane B-B' at the step corresponding to FIG. 9A.

Referring to FIGS. 9A and 9B, the semiconductor link structure 31 is thinned as in the first embodiment. The remaining portions of the semiconductor link structure 31 constitutes the semiconductor nanowire structure 32, which includes a first semiconductor pad 32A, a second semiconductor pad 32B, and a semiconductor nanowire 32C. The first semiconductor pad 32A and the second semiconductor pad 32B laterally abut the semiconductor nanowire 32C. The first end portion and the second end portion of the semiconductor nanowire 32C have horizontal cross-sectional areas of rectangles.

The middle portion of the semiconductor nanowire 32C has a rectangular vertical cross-sectional area having a first width w1 in the widthwise direction of the semiconductor nanowire 32C. The first end portion of the semiconductor nanowire 32C has a rectangular vertical cross-sectional area having a second width w2 in the widthwise direction of the semiconductor nanowire 32C. The second end portion of the semiconductor nanowire 32C has a rectangular vertical cross-sectional area having a third width w3 in the widthwise direction of the semiconductor nanowire 32C.

The first width w1 is less than the first initial width w1' because the semiconductor material is consumed during the thinning process. Preferably, the first width w1 is a sublithographic dimension, i.e., a dimension that is less than the smallest dimension that may be printed with a single lithographic exposure on a photoresist. Typically, the first width w1 is from 1 nm to 20 nm, although lesser and greater dimensions are also contemplated herein. Preferably, the first width w1 is from 2 nm to 10 nm. The second width w2 is less than the second initial width w2', and the third width w3 is less than the third initial width w3'. The second width w2 and the third width w3 are greater than the first width w1. The second width w2 and the third width w3 may be sublithographic dimensions or lithographic dimensions or a combination thereof. Typically, the second width w2 and the third width w3 are from 2 nm to 100 nm, although lesser and greater dimensions are also contemplated herein. The entirety of the semiconductor nanowire structure 32 may have the same thickness, which may be from 1 nm to 40 nm, and is typically from about 2 nm to about 20 nm, although lesser and greater thicknesses are also contemplated herein.

Figure 10A:
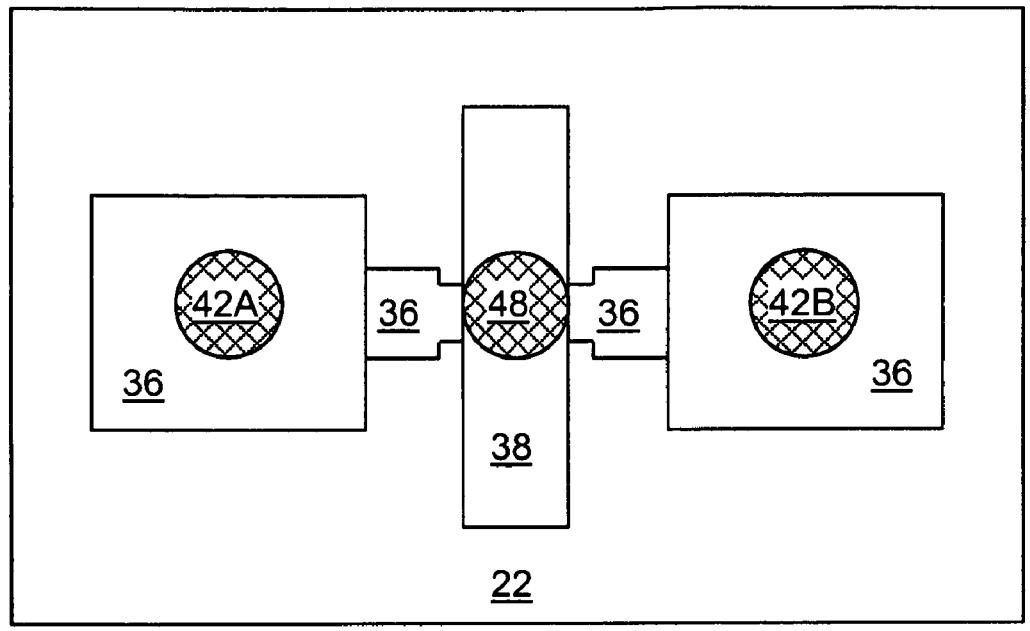
FIG. 10A is a top-down view of the first exemplary semiconductor structure after formation of a gate dielectric, a gate electrode, a middle-of-line (MOL) dielectric layer, and contact vias.
Figure 10B:
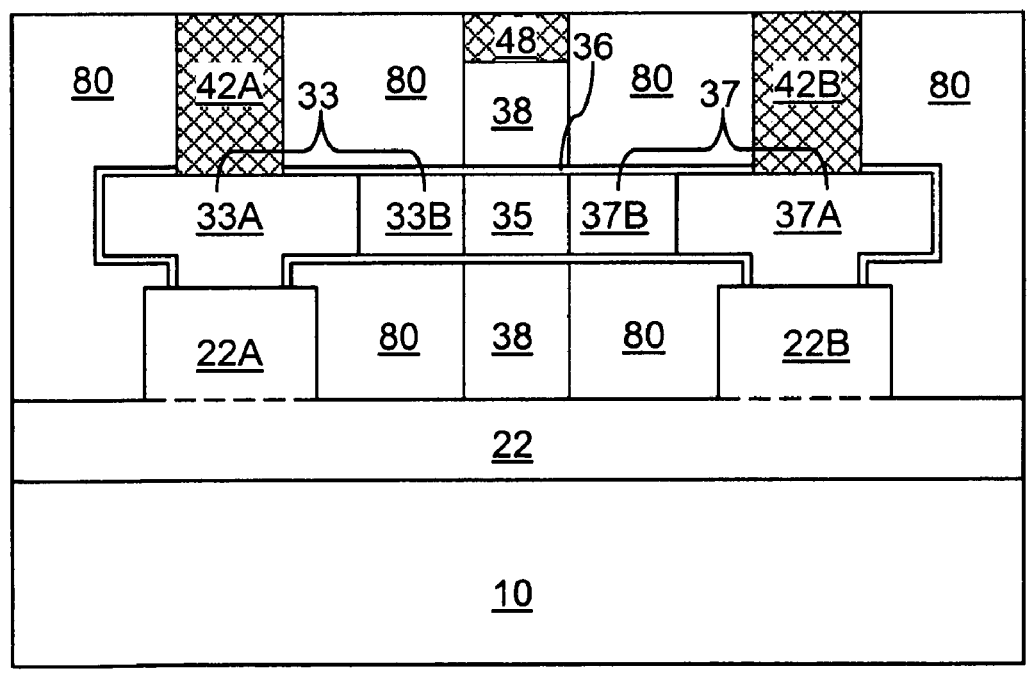
FIG. 10B is a vertical cross-sectional view of the exemplary semiconductor structure along the plane B-B' at the step corresponding to FIG. 10A.

Referring to FIGS. 10A and 10B, processing steps corresponding to FIGS. 5A, 5B, 6A, 6B, 7A, and 7B are performed in the same manner as in the first embodiment to form a semiconductor nanowire transistor including a channel region 35, a source region 33, a drain region 37, a gate dielectric 35, and a gate electrode 38.

Figure 11A:
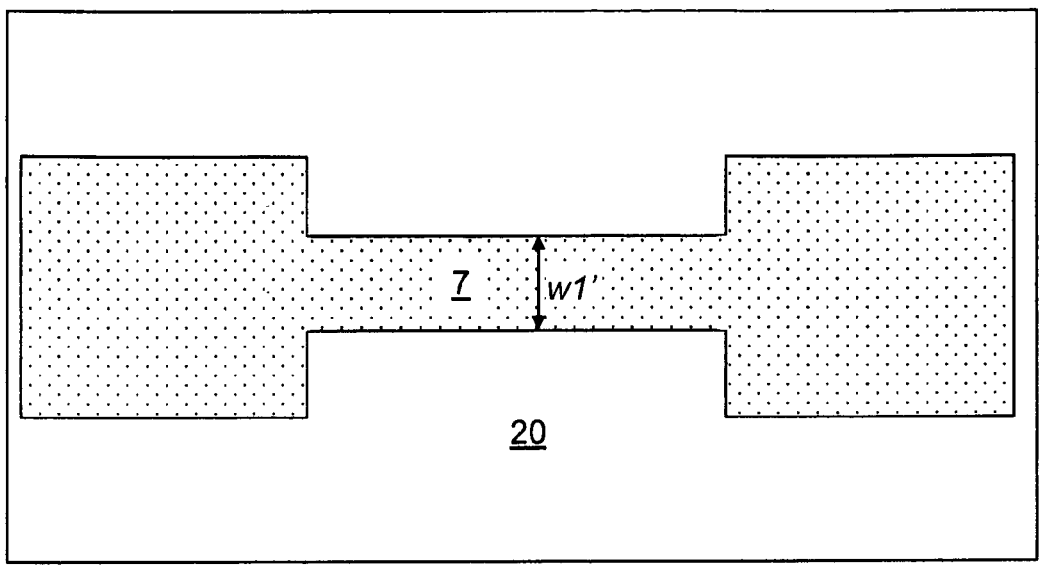
FIG. 11A is a top-down view of a third exemplary semiconductor structure after patterning of a semiconductor link portion and semiconductor pads.
Figure 11B:
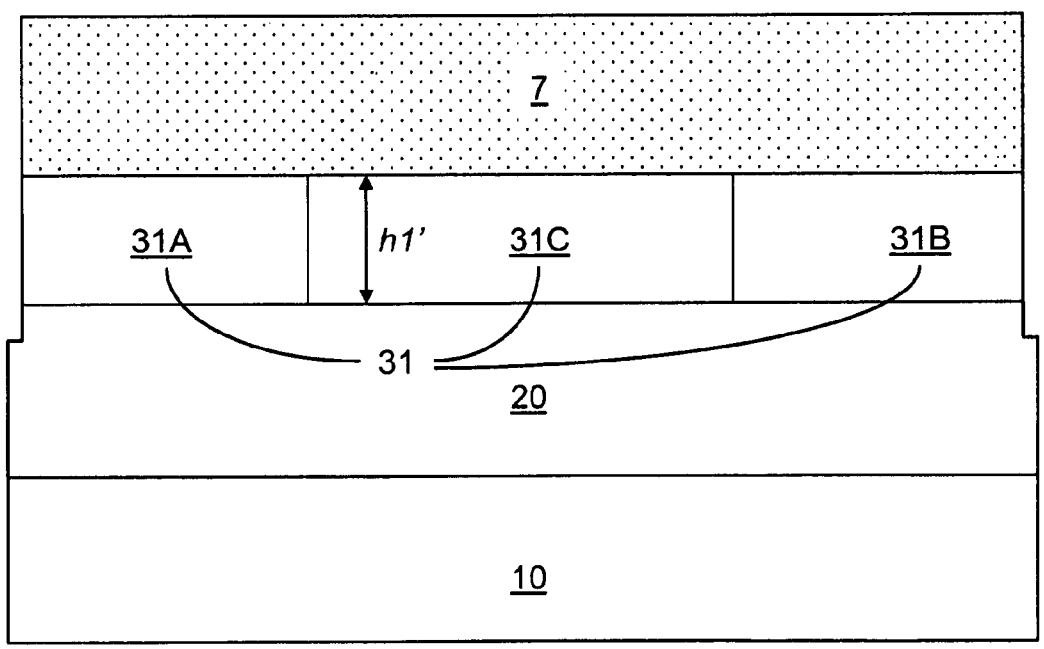
FIG. 11B is a vertical cross-sectional view of the exemplary semiconductor structure along the plane B-B' at the step corresponding to FIG. 11A.

Referring to FIGS. 11A and 11B, a third exemplary semiconductor structure according to a third embodiment of the present invention is derived from the first exemplary semiconductor structure of FIGS. 1A and 1B and the processing steps of FIGS. 2A and 2B. The photoresist 7 as patterned includes a constant-width middle portion having a first initial width w1. The constant-width middle portion is laterally adjoined by a first pad shape and a second pad shape, which have wider widths than the photoresist link shape. The lengthwise direction of the constant-width middle portion, which is horizontal and is perpendicular to the direction of the first initial width w1', is herein referred to as a first horizontal direction.

The pattern in the photoresist 7 is transferred into the top semiconductor layer 30 and an upper portion of the buried insulator layer 20 as in the first and second embodiments. The remaining portions of the top semiconductor layer 30 constitute a semiconductor link structure 31. The semiconductor link structure includes a semiconductor link portion 31C, a first prototype semiconductor pad 31A laterally abutting the semiconductor link portion 31C on one side, and a second prototype semiconductor pad 31B laterally abutting the semiconductor link portion 31C on an opposite side. The semiconductor link structure has a constant height throughout, which is herein referred to as a first initial height h1'.

The exposed sidewalls of the semiconductor link structure 31 are substantially vertically coincident with the sidewalls of the photoresist 7. Further, the sidewalls of the patterned portions of the buried insulator layer 20 are substantially vertically coincident with the sidewalls of the photoresist 7 and the sidewalls of the semiconductor link structure 31. The photoresist 7 is subsequently removed, for example, by ashing.

Figure 12A:
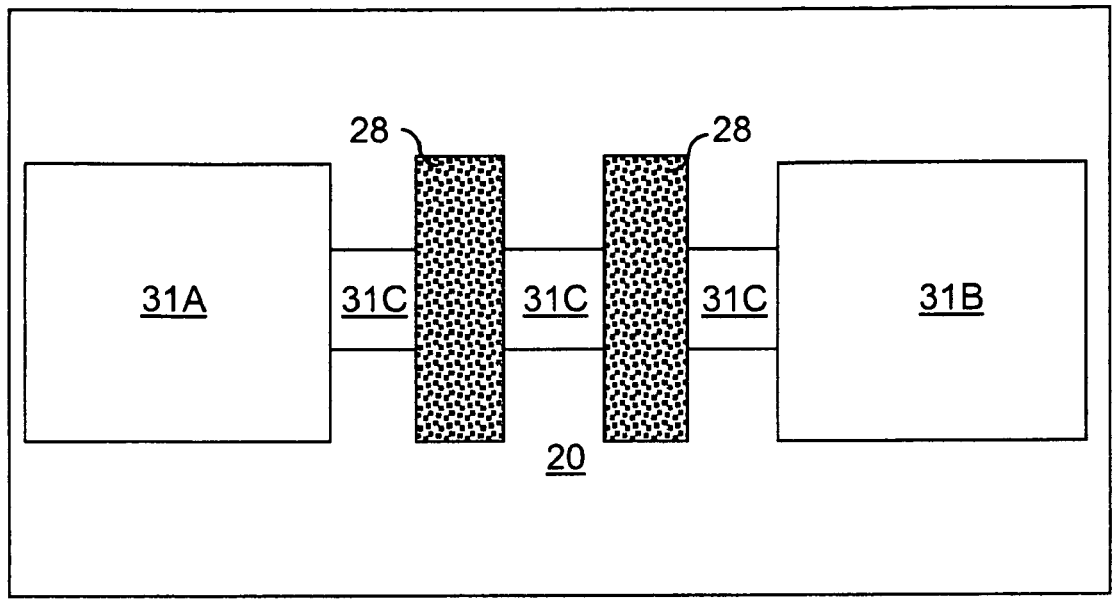
FIG. 12A is a top-down view of the third exemplary semiconductor structure after formation of oxidation barrier portions.
Figure 12B:
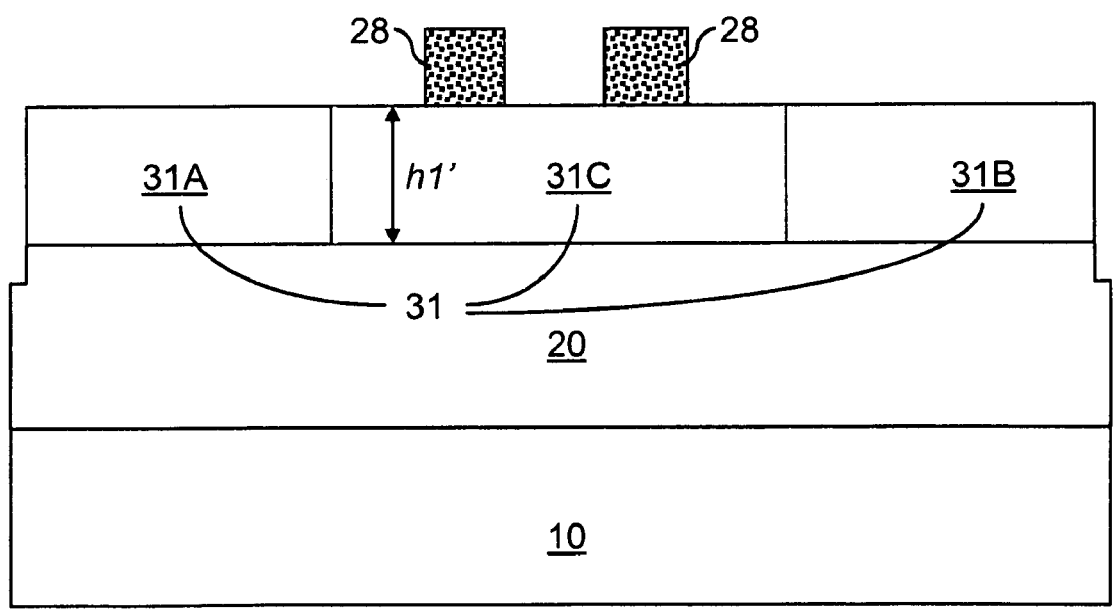
FIG. 12B is a vertical cross-sectional view of the exemplary semiconductor structure along the plane B-B' at the step corresponding to FIG. 12A.

Referring to FIGS. 12A and 12B, at least two oxidation barrier portions 28 are formed over at least two isolated sub-portions of the semiconductor link portion 31C. The at least two oxidation barrier portions 28 may be formed by deposition of an oxidation barrier layer, which may be a dielectric material layer that prevents diffusion of oxygen. For example, the oxidation barrier layer may comprise silicon nitride. The thickness of the oxidation barrier layer may be from 5 nm to 100 nm, although lesser and greater thicknesses are also contemplated. The oxidation barrier layer is lithographically patterned to form the at least two oxidation barrier portions 28. Each oxidation barrier portion 28 straddles over a sub-portion of the semiconductor link portion 31C. The at least two oxidation barrier portions 28 may have the form of strips having constant widths, which are lithographic dimensions, i.e., a dimension that may be formed by a single lithographic exposure. While the present invention is described with two oxidation barrier portions 28, embodiment are explicitly contemplated in which more than two oxidation barrier portions 28 are employed.

Figure 13A:
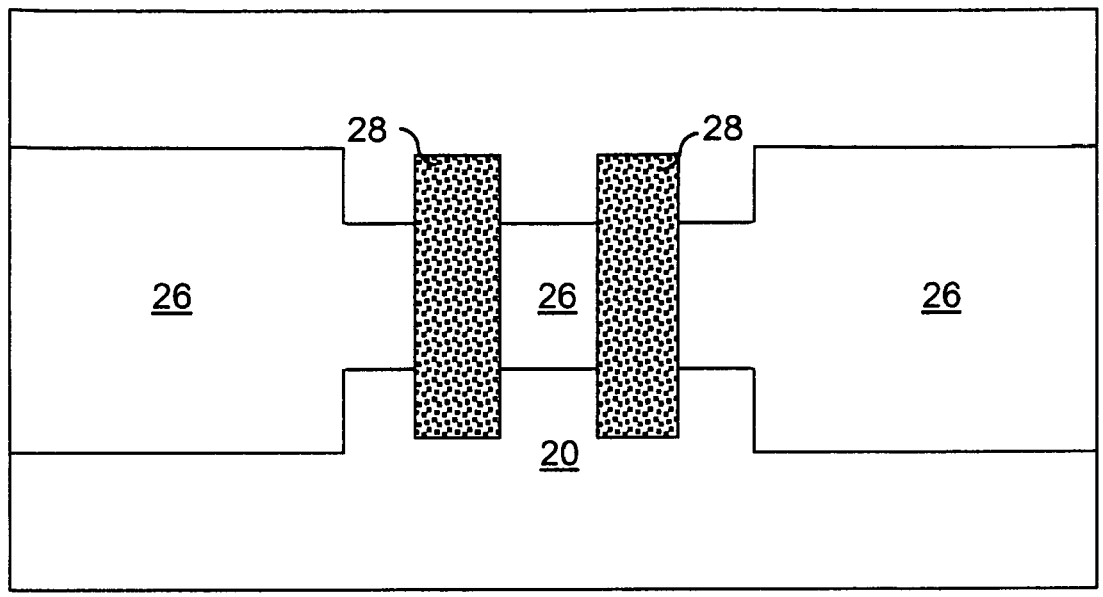
FIG. 13A is a top-down view of the third exemplary semiconductor structure after oxidation of exposed semiconductor portions.
Figure 13B:
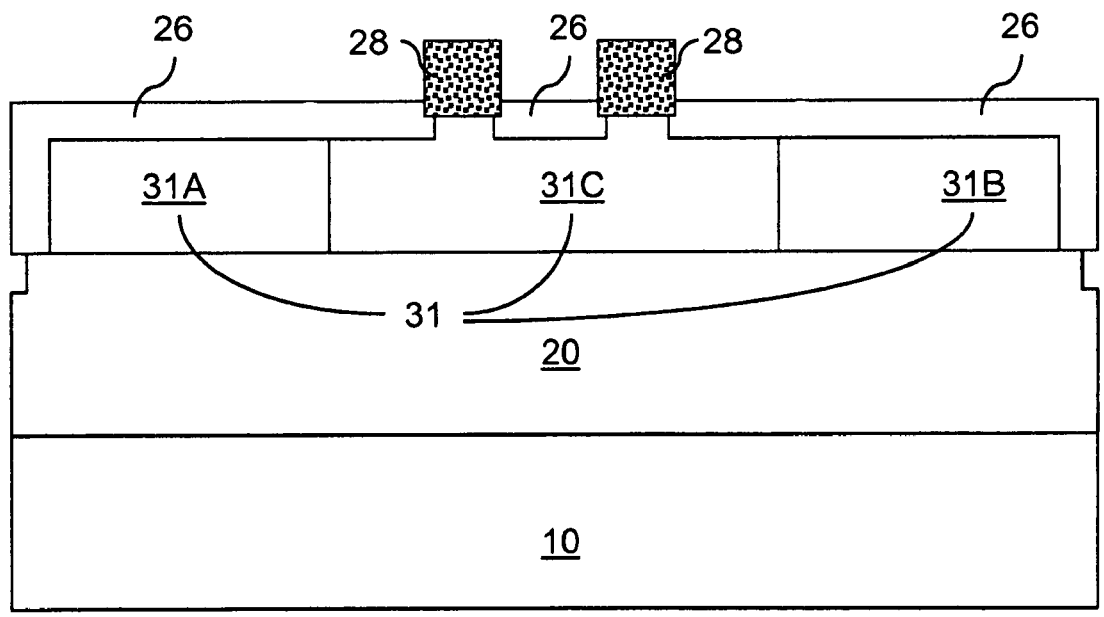
FIG. 13B is a vertical cross-sectional view of the exemplary semiconductor structure along the plane B-B' at the step corresponding to FIG. 13A.

Referring to FIGS. 13A and 13B, the exposed portions of the semiconductor link structure 31 is oxidized employing the at least two oxidation barrier portions 28 as masking layers. The oxidation of the exposed semiconductor surfaces of the semiconductor link structure 31 may be effected by thermal oxidation, plasma oxidation, or a combination thereof. The sub-portions of the semiconductor link structure 31 directly underneath the at least two oxidation barrier portions 28 are not oxidized because the at least two oxidation barrier portions 28 prevent diffusion of oxygen that is provided in the oxidizing ambient during the oxidation process. Oxidized material portions 26, which include the oxide of the semiconductor material of the semiconductor link structure 31, are formed on the exposed portions of the semiconductor link structure 31.

Figure 14A:
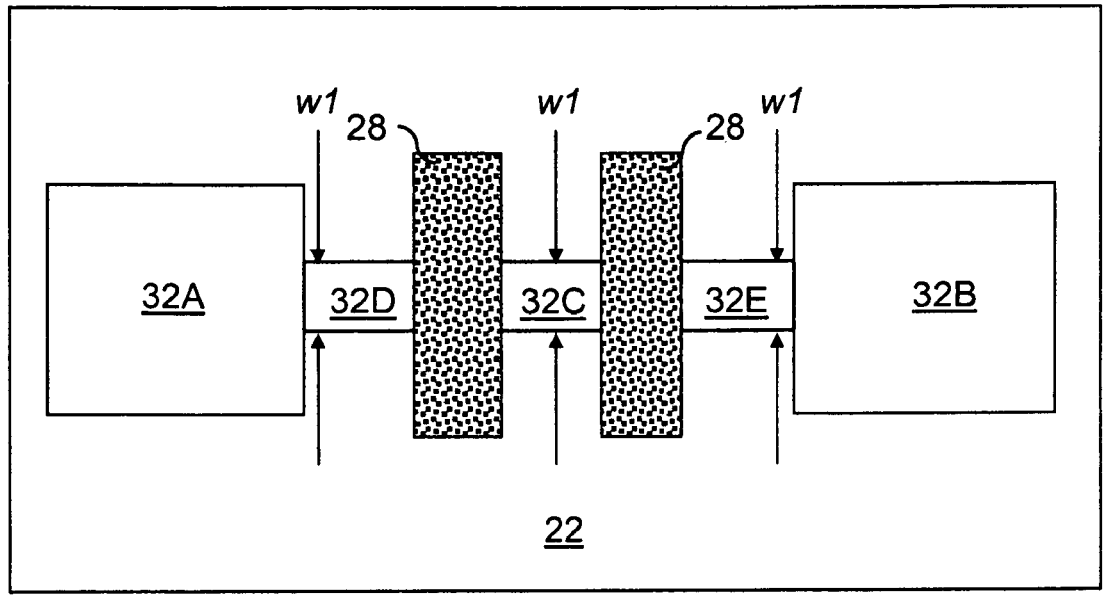
FIG. 14A is a top-down view of the third exemplary semiconductor structure after removal of oxidized portions and formation of a semiconductor nanowire and dielectric pedestals.
Figure 14B:
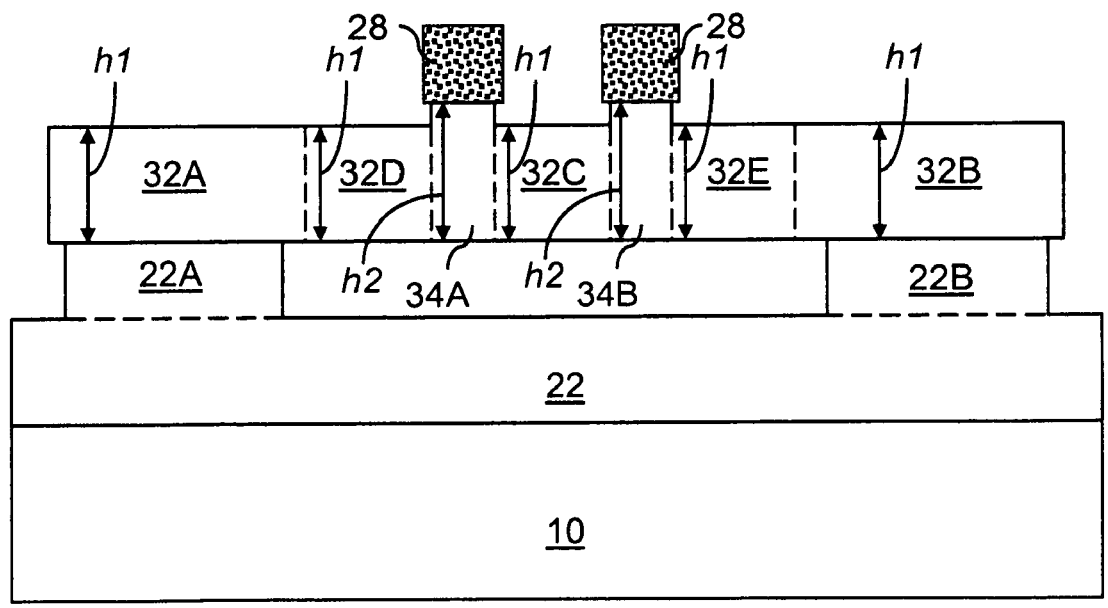
FIG. 14B is a vertical cross-sectional view of the exemplary semiconductor structure along the plane B-B' at the step corresponding to FIG. 14A.

Referring to FIGS. 14A and 14B, a substantially isotropic etch is performed on the dielectric material of the buried insulator layer 20 selective to the semiconductor material of the semiconductor link structure 31. The substantially isotropic etch is selective to the material of the oxidation barrier portions 28. The substantially isotropic etch may, or may not, be selective to the material of the oxidized material portions 26. The semiconductor link structure 31 is employed as an etch mask for the substantially isotropic etch. The substantially isotropic etch may be a wet etch or a dry etch.

The oxidized material portions 26 are removed selective to the semiconductor material of the semiconductor link structure 31 and the material of the oxidation barrier portions 28. The removal of the oxidized material portions 26 may be performed prior to, concurrently with, or after removal of the dielectric material of the buried insulator layer 20 by the substantially isotropic etch. In case the oxidized material portions 26 and the buried insulator layer 20 comprise the same material, the removal of the oxidized material portions 26 and the exposed portions of the buried insulator layer 20 may be performed simultaneously. For example, if the oxidation barrier portions 28 comprise silicon nitride and the oxidized material portions 26 and the buried insulator layer 20 comprise silicon oxide, hydrofluoric acid (HF) may be employed to remove the oxidized material portions 26 and the exposed portions of the buried insulator layer 20 selective to the oxidation barrier portions 28.

The size of the first prototype semiconductor pad 31A is reduced through the thinning process and the first prototype semiconductor pad 31A as thinned after the removal of the oxidized material portions 26 constitutes a first semiconductor pad 32A. Likewise, the size of the second prototype semiconductor pad 31B is reduced through the thinning process and the second prototype semiconductor pad 31A as thinned after the removal of the oxidized material portions 26 constitutes a second semiconductor pad 32A.

The semiconductor link portion 31C, as thinned at portions including the oxidized material portions 26, constitutes a semiconductor nanowire. The semiconductor nanowire includes a first constant-width portion 32C, a second constant-width portion 32D, a third constant width portion 32E, a first bulge portion 34A, and a second bulge portion 34B. The first bulge portion 34A laterally abuts the first constant-width portion 32C and the second constant width portion 32D. The second bulge portion 34B laterally abuts the first constant width portion 32C and the third constant width portion 32E.

The first, second, and third constant width portions (32C, 32D, 32E) have a first width w1, which is less than the first initial width w1'. The first and second bulge portions (34A, 34B) have a second width that is the same as the initial first width w1' (See FIG. 11A). The second width, i.e., the initial first width w1' is greater than the first width w1. The first, second, and third constant width portions (32C, 32D, 32E) have a first height h1, which is less than the first initial height h1'. The first and second bulge portions (34A, 34B) have a second height h2 that is the same as the initial first height h1' (See FIG. 11B). The second height h2 is greater than the first height h1. The bottom surfaces of the first, second, and third constant width portions (32C, 32D, 32E) and the first and second bulge portions (34A, 34B) are substantially coplanar.

Figure 15A:
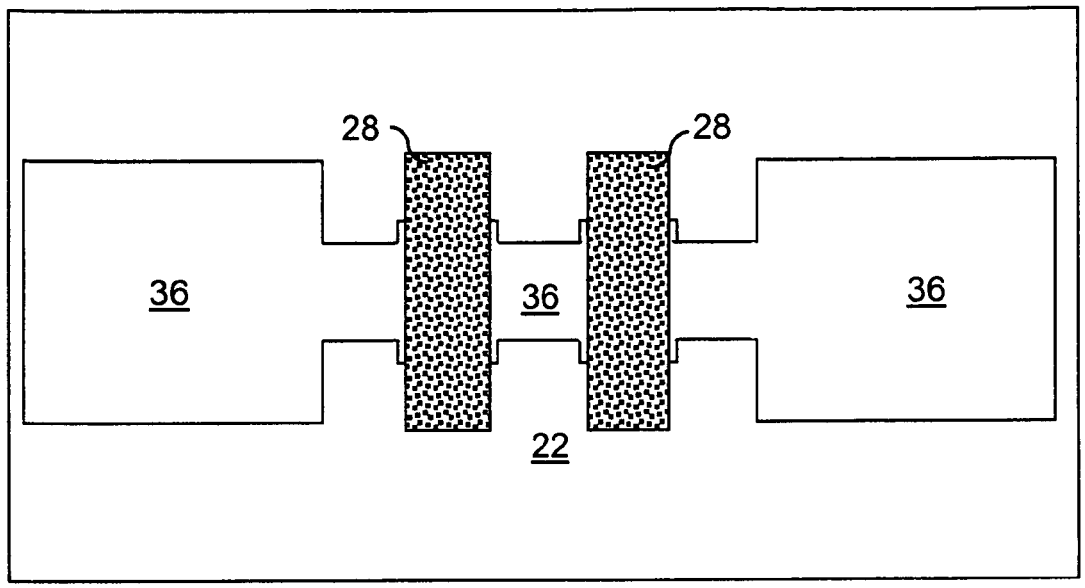
FIG. 15A is a top-down view of the third exemplary semiconductor structure after formation of a gate dielectric.
Figure 15B:
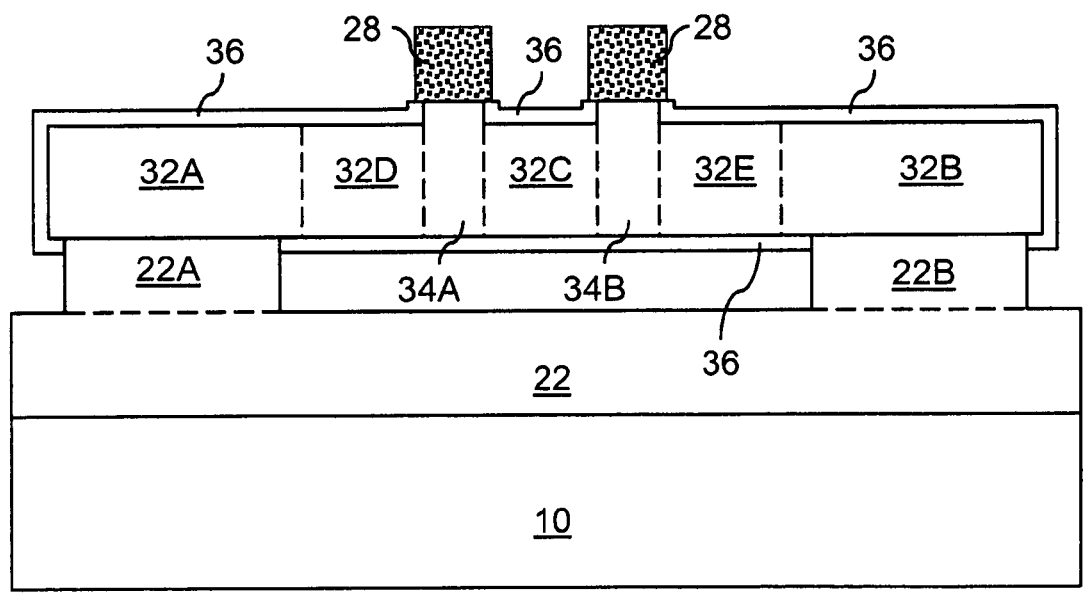
FIG. 15B is a vertical cross-sectional view of the exemplary semiconductor structure along the plane B-B' at the step corresponding to FIG. 15A.

Referring to FIGS. 15A and 15B, a gate dielectric 36 is formed on the exposed surfaces of the semiconductor nanowire structure 32 as in the first and second embodiments. If the gate dielectric 36 and comprises a dielectric material formed by thermal conversion of outer portions of the semiconductor nanowire structure 32, the gate dielectric 36 is formed only on the surfaces of the semiconductor nanowire structure 32. If the gate dielectric 36 may comprise a high-k dielectric material having a dielectric constant greater than 3.9, the gate dielectric 36 may be formed as a single contiguous gate dielectric layer covering the entirety of the top surfaces and sidewall surfaces of the semiconductor nanowire structure 32, the oxidation barrier portions 28, and all exposed surfaces of the dielectric material layer 22 including the first and second dielectric pedestals (22A, 22B).

Figure 16A:
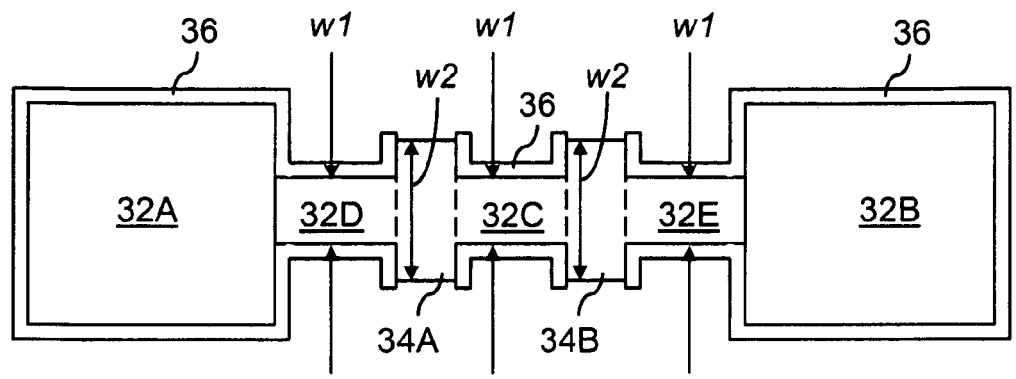
FIG. 16A is a horizontal cross-sectional view of the third exemplary semiconductor structure after removal of oxidation barrier portions along the plane A-A' of FIG. 16B.
Figure 16B:
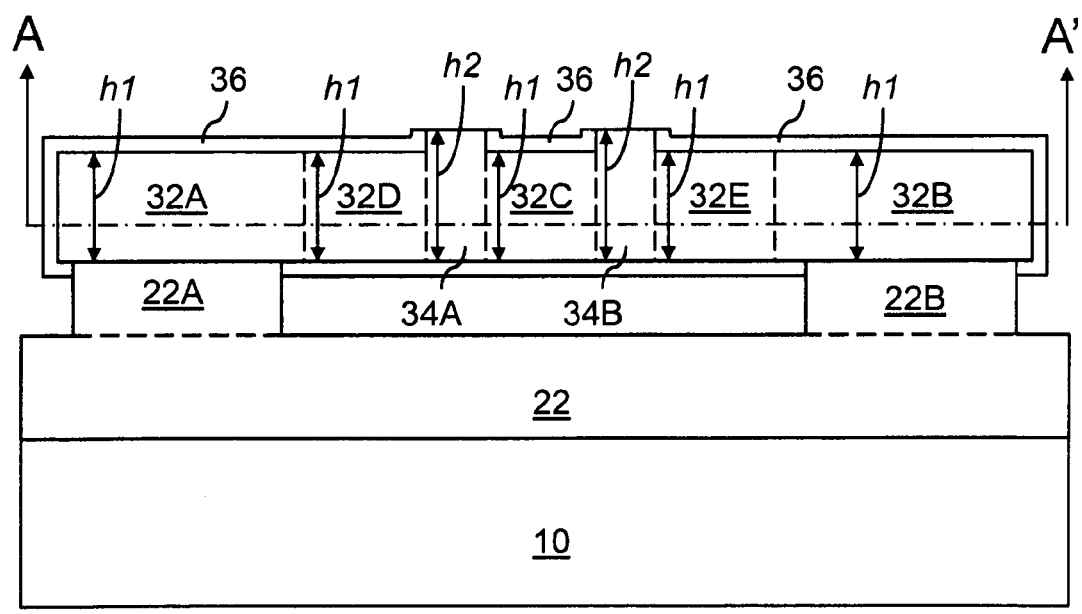
FIG. 16B is a vertical cross-sectional view of the exemplary semiconductor structure along the plane B-B' at the step corresponding to FIG. 16A.

Referring to FIGS. 16A and 16B, the oxidation barrier portions 28 are removed selective to the gate dielectric 36. FIG. 16A is a horizontal cross-sectional view along the plane A-A' in FIG. 16B. The first, second, and third constant width portions (32C, 32D, 32E) have a first width w1, and the first and second bulge portions (34A, 34B) have a second width w2, which is greater than the first width w1. The first and second semiconductor pads (32A, 32B) and the first, second, and third constant width portions (32C, 32D, 32E) have the first height h1, and the first and second bulge portions (34A, 34B) have a second height h2, which is greater than the first height h1.

Figure 17A:
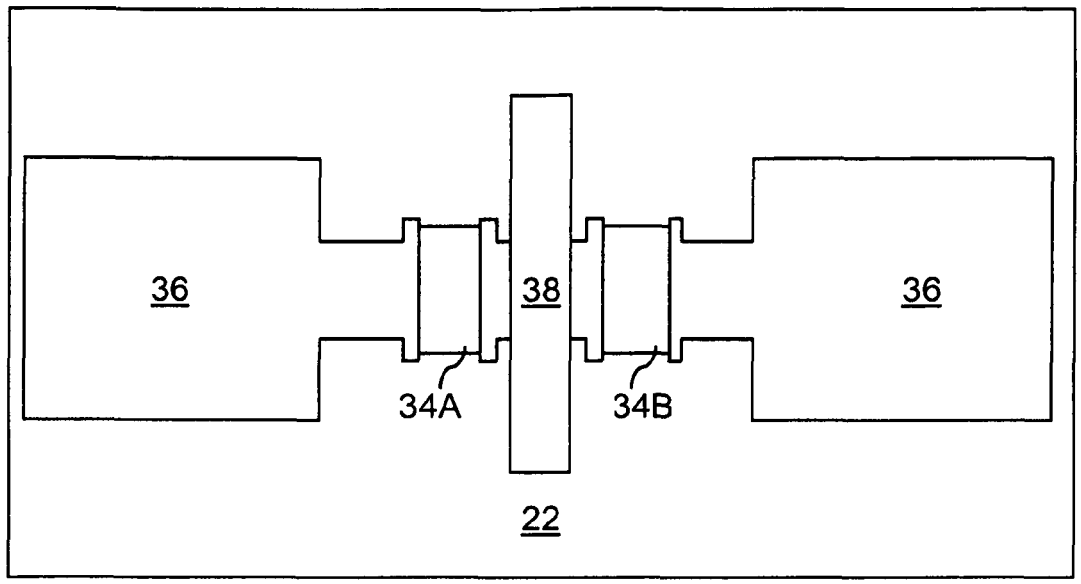
FIG. 17A is a top-down view of the third exemplary semiconductor structure after formation of a gate electrode.
Figure 17B:
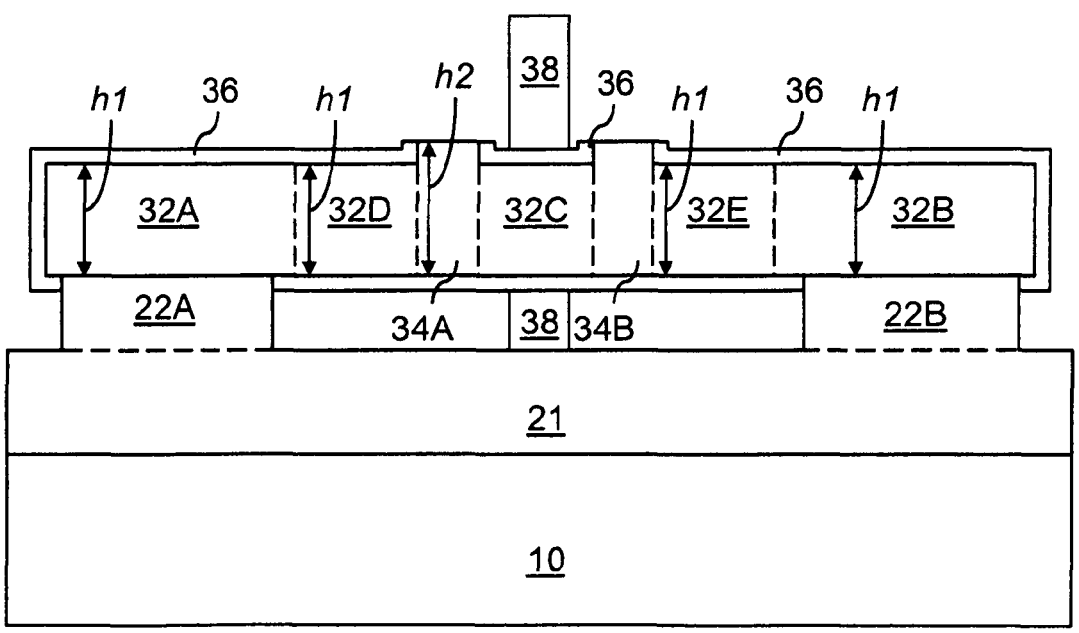
FIG. 17B is a vertical cross-sectional view of the exemplary semiconductor structure along the plane B-B' at the step corresponding to FIG. 17A.

Referring to FIGS. 17A and 17B, a gate electrode 38 is formed on and around the first constant-width portion 32. The gate electrode 38 comprises a conductive material as in the first and second embodiments. Preferably, the thickness of the deposited gate electrode material exceeds half the distance between the semiconductor nanowire (32C, 32D, 32E, 34A, 34B) and the dielectric material layer 22 so that the gate electrode 38 contains only one hole within which the semiconductor nanowire (32C, 32D, 32E, 34A, 34B) is located. The same conductive material may be employed for the gate electrode as in the first and second embodiments. Optionally, dielectric spacers (not shown) may be formed on the sidewalls of the gate electrode 38 as needed.

Figure 18A:
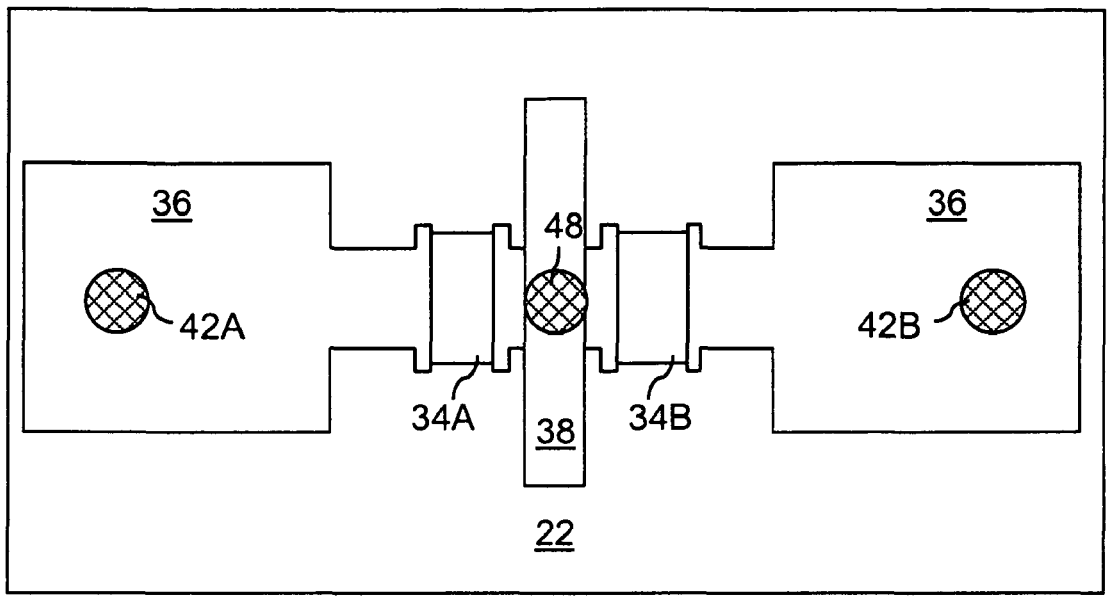
FIG. 18A is a top-down view of the third exemplary semiconductor structure after formation of a middle-of-line (MOL) dielectric layer and contact vias.
Figure 18B:
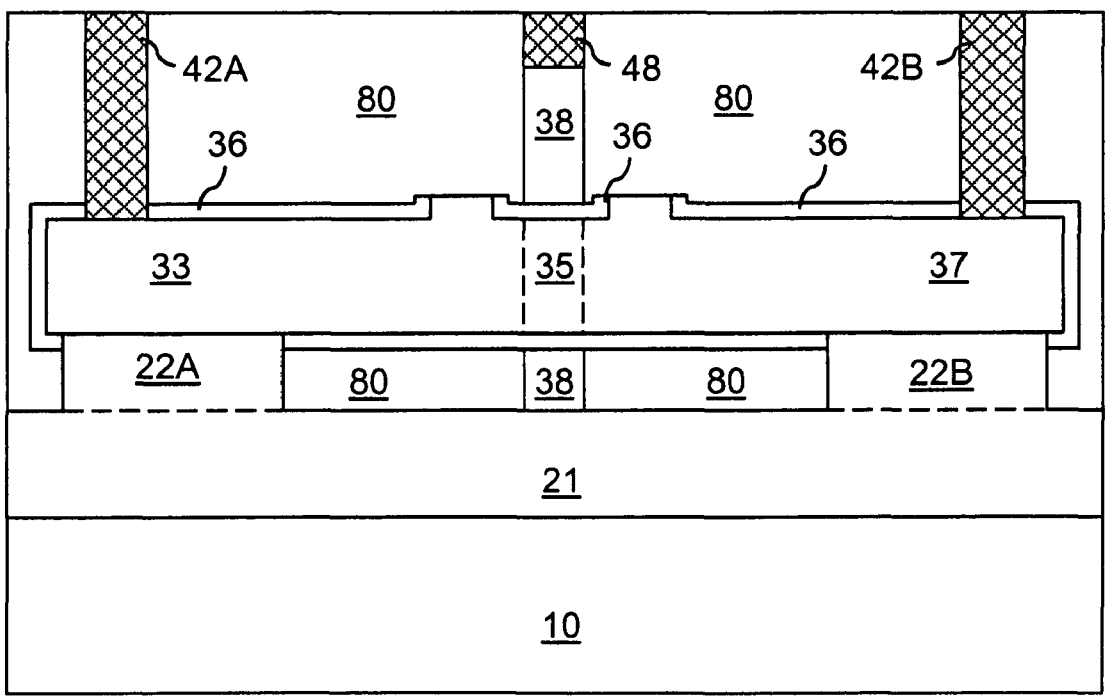
FIG. 18B is a vertical cross-sectional view of the exemplary semiconductor structure along the plane B-B' at the step corresponding to FIG. 18A.

Referring to FIGS. 18A and 18B, dopants of the second conductivity type are implanted into portions of the semiconductor nanowire structure 32 employing the gate electrode 38 as an ion implantation mask as in the first and second embodiments. The first semiconductor pad 32A (See FIG. 17B) and the second semiconductor pad 32B (See FIG. 17B) are doped with dopants of the second conductivity type. One end of the semiconductor nanowire (32C, 32D, 32E, 34A, 34B; See FIG. 17B) abutting the first semiconductor pad 32A is also doped with dopants of the second conductivity type and is herein referred to as a nanowire source portion. The pad source portion 33A and the nanowire source portion have a doping of the second conductivity type and are collectively called a source region 33. The other end of the semiconductor nanowire (32C, 32D, 32E, 34A, 34B; See FIG. 17B) abutting the second semiconductor pad 32B is also doped with dopants of the second conductivity type and is herein referred to as a nanowire drain portion. The second semiconductor pad 32B and the nanowire drain portion have a doping of the second conductivity type and are collectively called a drain region 37. The middle portion of the semiconductor nanowire (32C, 32D, 32E, 34A, 34B; See FIG. 17B) that is not implanted with dopants of the second conductivity type has a doping of the first conductivity type, and is herein referred to as a first channel region 35. The first channel region 35 laterally abuts the source region 33 and the drain region 37. The first channel region 35, the source region 33, the drain region 37, the gate dielectric 36, and the gate electrode 38 collectively constitute a semiconductor nanowire transistor that controls the flow of current through the semiconductor nanowire.

Preferably, the interface between the channel region 35 and the source region 33 is within the first constant width portion 32C (See FIG. 17B) having the first width w1. Similarly, the interface between the channel region 35 and the drain region 37 is preferably within the first constant width portion 32C (See FIG. 17B) having the first width w1. Positioning the p-n junctions within the first constant width portion 32C (See FIG. 17B) provides well controlled device characteristics for the semiconductor nanowire transistor that is formed on the semiconductor nanowire.

A middle-of-line (MOL) dielectric material layer 80 and various contact vias (42A, 42B, 48) are formed in the same manner as in the first and second embodiments. The top surfaces of the MOL dielectric layer 80, the source-side contact via 42A, the drain-side contact via 42B, and the first gate-side contact via 48 may be substantially coplanar after planarization of the MOL dielectric layer 80 and removal of the excess conductive material. Additional metal interconnect structures (not shown) including a first level metal wiring (not shown) may be formed above the MOL dielectric layer 80 as in the first and second embodiments.

Figure 19A:
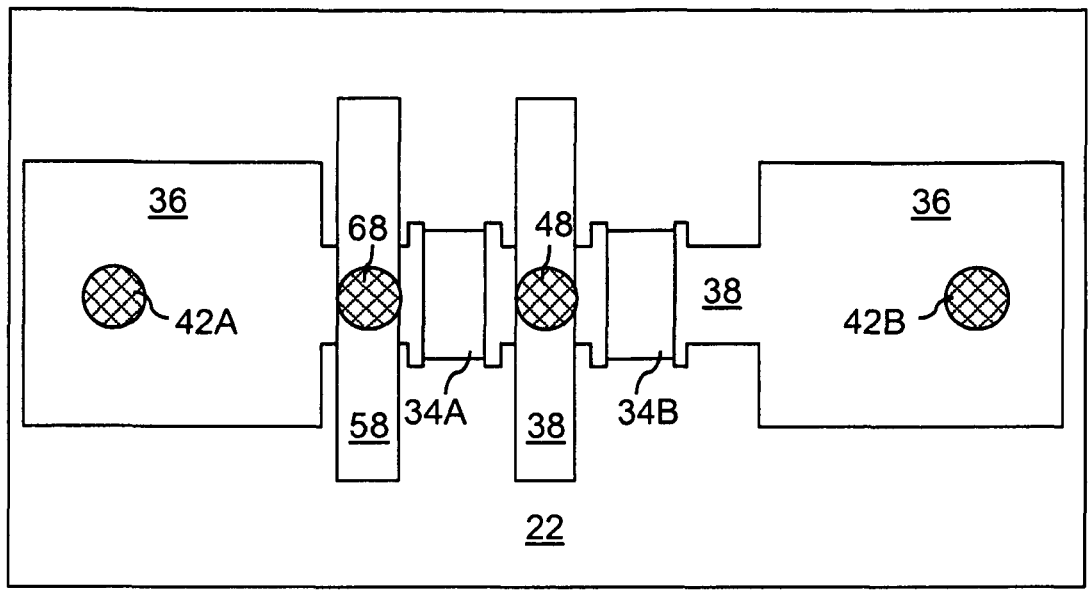
FIG. 19A is a top-down view of a fourth exemplary semiconductor structure.
Figure 19B:
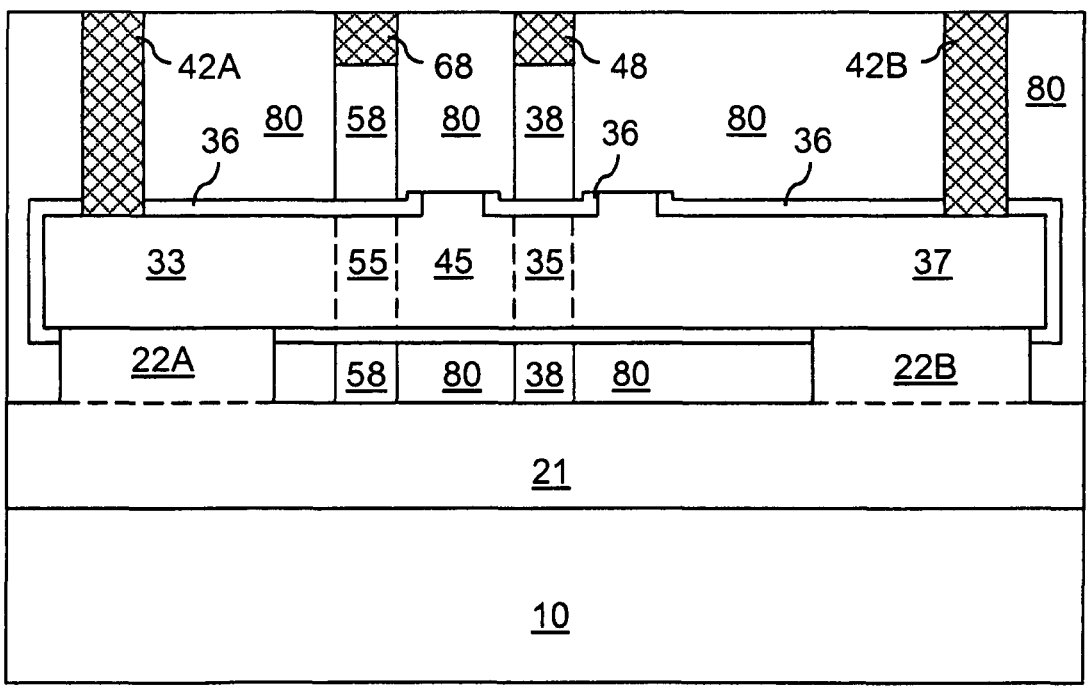
FIG. 19B is a vertical cross-sectional view of the exemplary semiconductor structure along the plane B-B' at the step corresponding to FIG. 19A.

Referring to FIGS. 19A and 19B, a fourth exemplary semiconductor structure according to a fourth embodiment of the present invention is derived from the third exemplary semiconductor structure by forming a second gate electrode 58 on the gate dielectric 36 concurrently with the formation of the gate electrode 38. The MOL dielectric material layer 80 is omitted in FIG. 19A for clarity. A second channel region 55 having a doping of the first conductivity type is formed in the second constant-width portion 32D (See FIG. 17B) within an area that is shielded by the second gate electrode 58 during the implantation of the dopants of the second conductivity type. An additional node, which may be a first additional source/drain node 45 for the channel region 35 and the second channel region 55, having a doping of the second conductivity type is formed between the channel region 35 and the second channel region 55. A first additional source/drain node contact 68 may be formed in the MOL dielectric material layer 80. Optionally but not necessarily, a first additional contact via (not shown) may be formed on the first additional source/drain node 45.

Figure 20A:
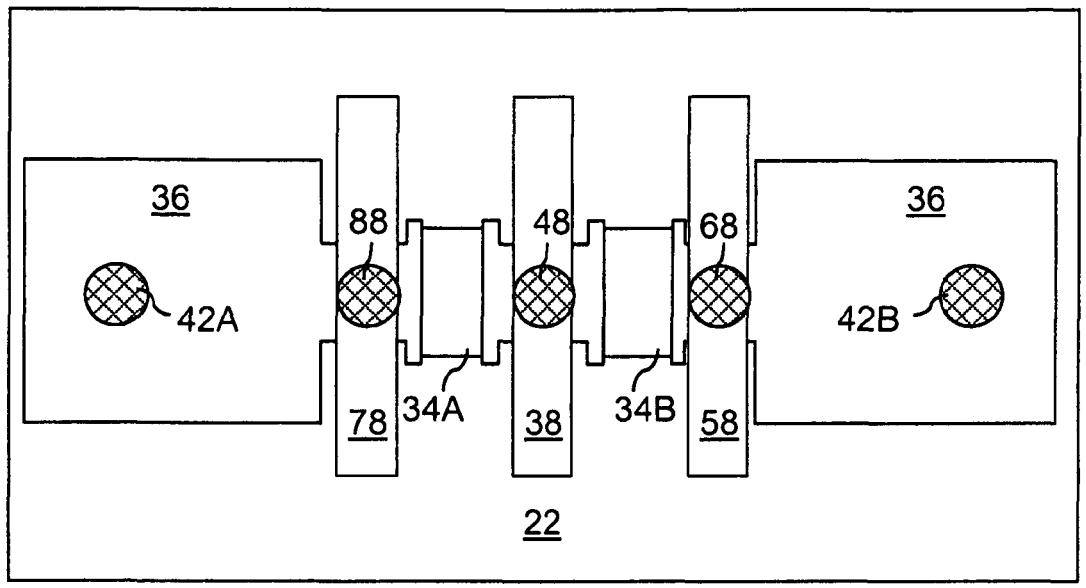
FIG. 20A is a top-down view of a fifth exemplary semiconductor structure.
Figure 20B:
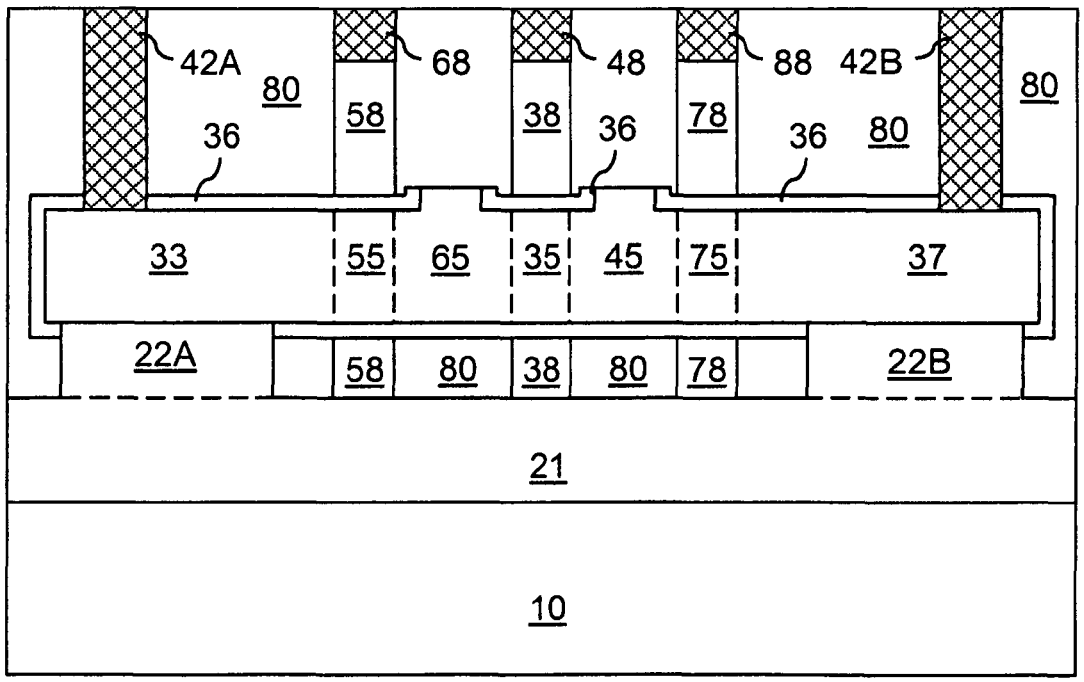
FIG. 20B is a vertical cross-sectional view of the exemplary semiconductor structure along the plane B-B' at the step corresponding to FIG. 20A.

Referring to FIGS. 20A and 20B, a fifth exemplary semiconductor structure according to a fifth embodiment of the present invention is derived from the fourth exemplary semiconductor structure by forming a third gate electrode 78 on the gate dielectric 36 concurrently with the formation of the gate electrode 38 and the second gate electrode 58. The MOL dielectric material layer 80 is omitted in FIG. 20A for clarity. A third channel region 75 having a doping of the first conductivity type is formed in the third constant-width portion 32E (See FIG. 17B) within an area that is shielded by the third gate electrode 78 during the implantation of the dopants of the second conductivity type. Another additional node, which may be a second additional source/drain node 65 for the channel region 35 and the third channel region 75, having a doping of the second conductivity type is formed between the channel region 35 and the third channel region 75. A second additional source/drain node contact 88 may be formed in the MOL dielectric material layer 80. Optionally but not necessarily, a second additional contact via (not shown) may be formed on the second additional source/drain node 65.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
   a semiconductor nanowire having a constant-width portion located between a first end portion and a second end portion, wherein said constant-width portion has a constant first initial width between said first end portion and said second end portion;
   a first semiconductor pad located on a substrate and adjoining said first end portion of said semiconductor nanowire, wherein said first end portion has a second initial width that is greater than said first initial width at an interface with said first semiconductor pad;
   a second semiconductor pad located on said substrate and adjoining said second end portion of said semiconductor nanowire, wherein said second end portion has a first width that is greater than said second initial width at an interface with said second semiconductor pad;
   a channel region located in said constant-width portion of said semiconductor nanowire and having a doping of a first conductivity type;
   a gate dielectric located on and surrounding said channel region; and
   a gate electrode located on and surrounding said gate dielectric.

2. The semiconductor structure of claim 1, wherein said first end portion has a width that monotonically increases from an interface with said constant-width portion to said interface with said first semiconductor pad, and wherein said second end portion has a width that monotonically increases from an interface with said constant-width portion to said interface with said second semiconductor pad.

3. The semiconductor structure of claim 1, wherein each of said first end portion and said second end portion has a horizontal cross-sectional area having a shape of a trapezoid.

4. The semiconductor structure of claim 1, wherein each of said first end portion and said second end portion has a horizontal cross-sectional area having a shape of a rectangle.

5. The semiconductor structure of claim 1, further comprising an insulator layer located in said substrate and underlying said semiconductor nanowire and including a first dielectric pedestal and a second dielectric pedestal, wherein said first dielectric pedestal is located on said first semiconductor pad, and wherein said second dielectric pedestal is located on said second semiconductor pad.

6. The semiconductor structure of claim 1, further comprising:
   a source region including at least said first end portion of said semiconductor nanowire and having of a doping of a second conductivity type, wherein said second conductivity type is the opposite of said first conductivity type; and
   a drain region including at least said second end portion of said semiconductor nanowire and having a doping of said second conductivity type.

7. The semiconductor structure of claim 1, further comprising a dielectric material structure of integral construction and including a dielectric material layer and first and second dielectric pedestals, wherein said first and second dielectric pedestals are located directly above a top surface of said dielectric material layer, said first dielectric pedestal contacts said first semiconductor pad, said second dielectric pedestal contacts said second semiconductor pad, and said top surface of said dielectric material layer is vertically spaced from said semiconductor nanowire by at least a height of said first and second dielectric pedestals.

8. A semiconductor structure comprising a semiconductor nanowire located over a substrate, said semiconductor nanowire having a first constant-width portion, a second constant-width potion, a third constant-width portion, a first bulge portion, and a second bulge portion, wherein said first bulge portion is located between said first constant-width portion and said second constant-width portion, wherein said second bulge portion is located between said first constant-width portion and said third constant-width portion, wherein said first, second, and third constant-width portions have a first initial width, and wherein said first and second bulge portions have a second initial width that is greater than said first initial width, wherein said first constant-width portion, said second constant-width potion, said third constant-width portion, said first bulge portion, and said second bulge portion are single crystalline and epitaxially aligned among one another.

9. The semiconductor structure of claim 8, further comprising:
a first semiconductor pad located on said substrate and adjoining said second constant-width portion; and
a second semiconductor pad located on said substrate and adjoining said third constant-width portion.

10. The semiconductor structure of claim 9, further comprising an insulator layer located in said substrate and underlying said semiconductor nanowire, said insulator layer including a first dielectric pedestal and a second dielectric pedestal, wherein said first dielectric pedestal is located on said first semiconductor pad, and wherein said second dielectric pedestal is located on said second semiconductor pad.

11. The semiconductor structure of claim 9, further comprising:
a channel region having a doping of a first conductivity type and located in said first constant-width portion of said semiconductor nanowire;
a gate dielectric located on and surrounding said channel region;
a gate electrode located on and surrounding said gate dielectric;
a source region including at least said first semiconductor pad and having of a doping of a second conductivity type, wherein said second conductivity type is the opposite of said first conductivity type; and
a drain region including at least said second semiconductor pad and having a doping of said second conductivity type.

12. The semiconductor structure of claim 11, further comprising:
a second channel region having a doping of said first conductivity type and located in said second constant-width portion of said semiconductor nanowire; and
a second-conductivity type region located between said first channel and said second channel.

13. The semiconductor structure of claim 12, further comprising:
a third channel region having a doping of said first conductivity type and located in said third constant-width portion of said semiconductor nanowire; and
another second-conductivity type region located between said first channel and said third channel.

14. A method of forming a semiconductor structure comprising:
forming a semiconductor link portion laterally adjoined by a first semiconductor pad and a second semiconductor pad on a substrate, wherein said semiconductor link portion includes a middle portion having a constant width, a first end portion that is wider than said middle portion at an interface with said first semiconductor pad, and a second end portion that is wider than said middle portion at an interface with said second semiconductor pad;
converting exposed semiconductor material of said semiconductor link portion and said first and second semiconductor pads into a dielectric material; and
removing said dielectric material, wherein a semiconductor nanowire having a constant-width portion, a first end portion, and a second end portion is formed by a remaining portion of said semiconductor link portion.

15. The method of claim 14, wherein said constant-width portion has a constant first initial width between said first end portion and said second end portion, wherein said first end portion has a second initial width that is greater than said first initial width at an interface with said first semiconductor pad, and wherein said second end portion has a first width that is greater than said second initial width at an interface with said second semiconductor pad.

16. The method of claim 14, further comprising forming a first dielectric pedestal and a second dielectric pedestal by patterning an insulator layer in said substrate, wherein said first dielectric pedestal is located on said first semiconductor pad and said second dielectric pedestal is located on said second semiconductor pad.

17. A method of forming a semiconductor structure comprising:
forming a semiconductor link portion having a constant width and laterally adjoined by a first semiconductor pad and a second semiconductor pad on a substrate;
forming two oxidation barrier portions over sub-portions of said semiconductor link portion;
forming oxidized material portions by converting exposed portions of said semiconductor link portion into a semiconductor oxide, wherein said two oxidation barrier portions prevent oxidation of said sub-portions; and
removing said oxidized material portions, wherein remaining portions of said semiconductor link portion constitutes a semiconductor nanowire including three constant-width portions separated by two bulge portions having a greater width than said three constant-width portions.

18. The method of claim 17, wherein said semiconductor nanowire has a first constant-width portion, a second constant-width potion, a third constant-width portion, a first bulge portion, and a second bulge portion, wherein said first bulge portion is located on said first constant-width portion and said second constant-width portion, wherein said second bulge portion is located on said first constant-width portion and said third constant-width portion, wherein said first, second, and third constant-width portions have a first width, and wherein said first and second bulge portions have a second width that is greater than said first initial width.

19. The method of claim 18, further comprising:
forming a gate dielectric on and around said first constant-width portion;
forming a gate electrode on and around said gate dielectric;
forming a source region including at least said first semiconductor pad and having of a doping of a second conductivity type, wherein said second conductivity type is the opposite of said first conductivity type; and forming a drain region including at least said second semiconductor pad and having a doping of said second conductivity type.

20. The method of claim 17, further comprising forming a first dielectric pedestal and a second dielectric pedestal by patterning an insulator layer in said substrate, wherein said first dielectric pedestal is located on said first semiconductor pad and said second dielectric pedestal vertically abuts said second semiconductor pad.

* * * * *